United States Patent
Rosenbaum et al.

(10) Patent No.: US 11,424,717 B2
(45) Date of Patent: Aug. 23, 2022

(54) HIGH-SPEED CLOSED-LOOP SWITCH-MODE BOOST CONVERTER

(71) Applicant: Silanna Asia Pte Ltd, Singapore (SG)

(72) Inventors: Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 61 days.

(21) Appl. No.: 16/938,294

(22) Filed: Jul. 24, 2020

(65) Prior Publication Data

US 2022/0029541 A1 Jan. 27, 2022

(51) Int. Cl.
*H03F 1/02* (2006.01)
*H02M 1/44* (2007.01)
*H02M 3/158* (2006.01)

(52) U.S. Cl.
CPC ............. *H03F 1/0227* (2013.01); *H02M 1/44* (2013.01); *H02M 3/1588* (2013.01); *H03F 2200/102* (2013.01)

(58) Field of Classification Search
CPC .. H03F 1/0227; H03F 2200/102; H02M 1/44; H02M 3/1588
USPC .......................................... 330/127, 129, 10
See application file for complete search history.

(56) References Cited

U.S. PATENT DOCUMENTS

| | | |
|---|---|---|
| 2006/0132234 A1 | 6/2006 | Nguyen |
| 2008/0224769 A1 | 9/2008 | Markowski et al. |
| 2009/0160422 A1 | 6/2009 | Isobe et al. |
| 2012/0062323 A1 | 3/2012 | Gallou et al. |
| 2015/0126141 A1 | 5/2015 | Arno |
| 2016/0380539 A1* | 12/2016 | Fukumoto ............... H02M 1/08 323/271 |

OTHER PUBLICATIONS

Gallou, Nicolas Le, Over 10MHz Bandwidth Envelope-Tracking DC/DC converter for Flexible High Power GaN Amplifiers, Microwave Symposium Digest (MTT), 2011 IEEE MTT-S International, Aug. 4, 2011, 4 pgs, Baltimore, MD.
Lee, Signals and the frequency domain, ENGR40M lecture notes, Stanford University, Jul. 31, 2017, 6 pages.

* cited by examiner

*Primary Examiner* — Khanh V Nguyen
*Assistant Examiner* — Khiem D Nguyen
(74) *Attorney, Agent, or Firm* — MLO, a professional corp.

(57) ABSTRACT

A closed-loop switch-mode boost converter includes a switching signal generator circuit, a switch-mode boost amplifier, a filter circuit, and an error amplifier circuit. The switching signal generator circuit receives an input signal and outputs a switching signal. A duty-cycle of the switching signal has a first non-linear relationship to an amplitude of the input signal. The switch-mode boost amplifier receives the switching signal and produces an output signal. An amplitude of the output signal has a second non-linear relationship to the duty-cycle of the switching signal, and the output signal has a linear relationship to the input signal based on the first and second non-linear relationships. The filter circuit receives the output signal and outputs a filtered output signal. The error amplifier circuit receives the input signal and the filtered output signal and produces a feedback control signal. The filtered output signal is adjusted based on the feedback control signal.

23 Claims, 17 Drawing Sheets

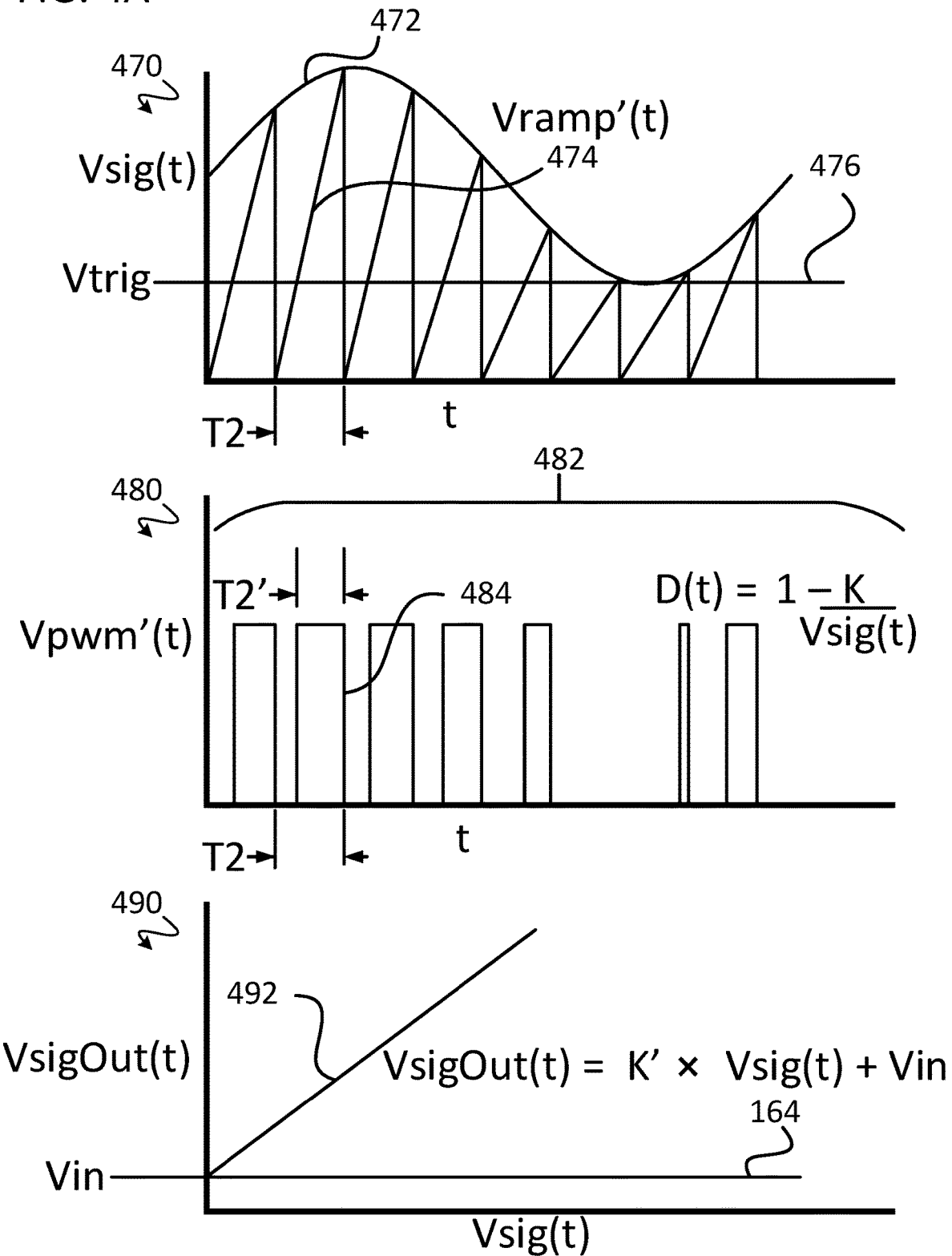

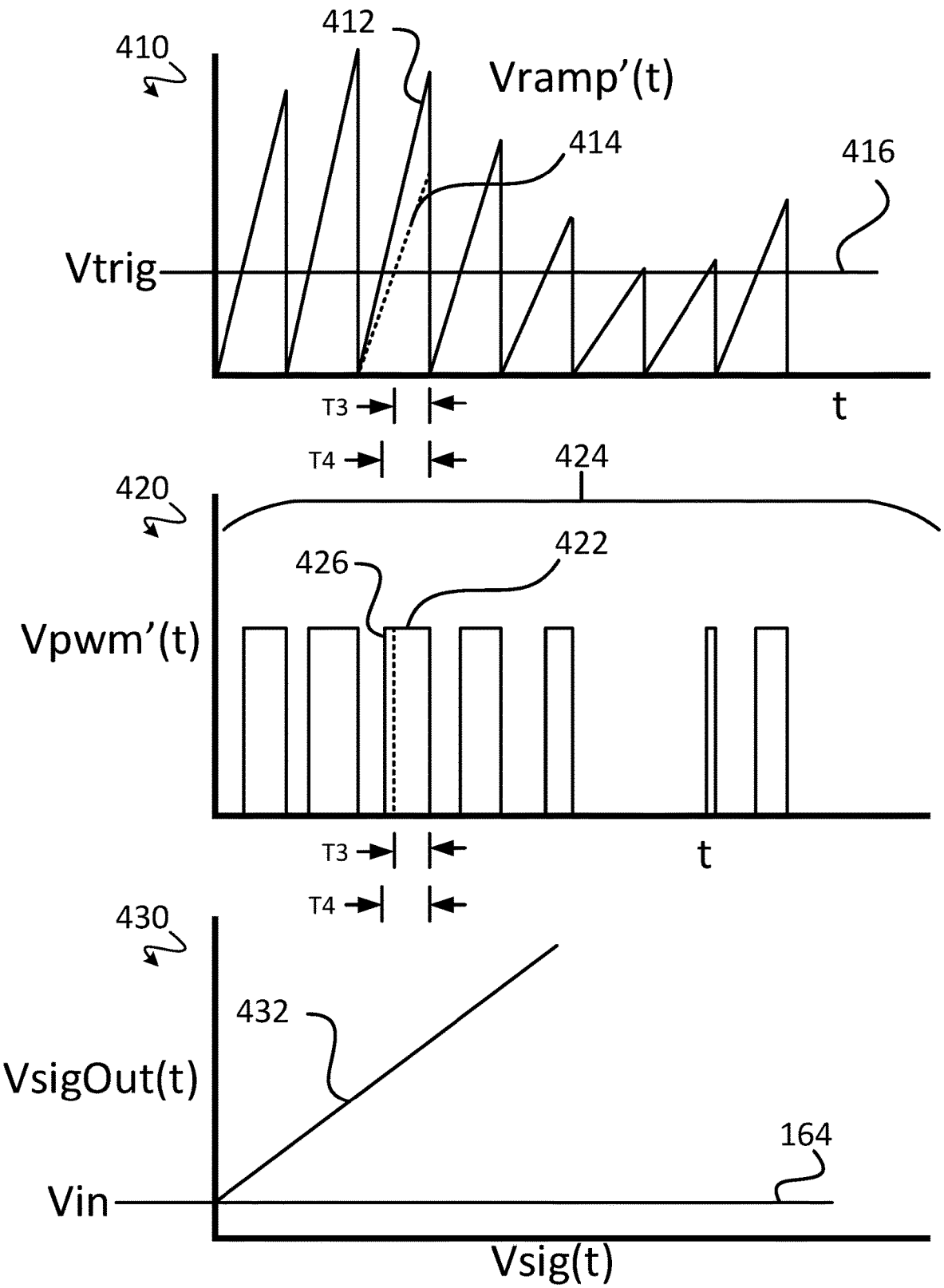

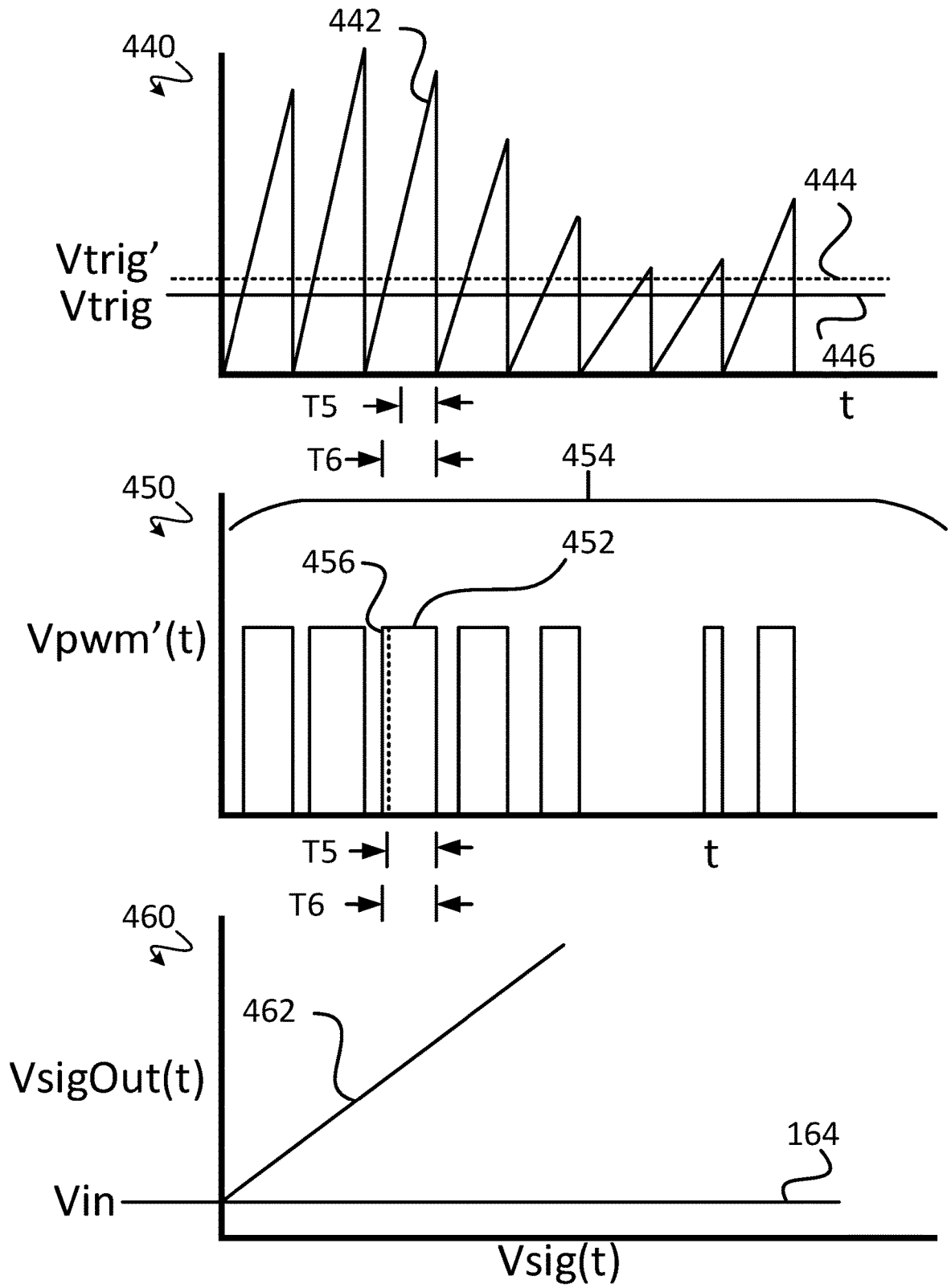

HIGH-SPEED CLOSED-LOOP SWITCH-MODE BOOST CONVERTER

BACKGROUND

Some systems that amplify high-bandwidth signals use a first power converter circuit (typically a switch-mode boost power converter) to boost a DC voltage up to a fixed high-voltage rail. The fixed high-voltage rail is used as an input voltage to a second power converter circuit. The second power converter circuit is suitable for amplifying time-varying signals which have a high maximum frequency component or signal bandwidth. The second power converter is often realized as a linear power converter circuit, and in some cases, as a switch-mode buck converter circuit. In such systems, the second power converter circuit receives the time-varying signal and steps down the input voltage of the fixed high-voltage rail to generate an amplified form of the time-varying signal.

In some systems, the first power converter circuit generates the high-voltage rail such that it follows an outer amplitude envelope of the amplified time-varying signal (i.e., a low frequency component of the time-varying signal) and the second power converter generates a high-frequency component of the amplified time varying signal. In such systems, a voltage difference between an amplitude of the amplified high-frequency component and the outer amplitude envelope may result in power efficiency losses.

SUMMARY

In some embodiments, a closed-loop switch-mode boost converter includes a switching signal generator circuit, a switch-mode boost amplifier circuit, a filter circuit, and an error amplifier circuit. The switching signal generator includes a signal input node for receiving a time-varying input signal, and a switching signal output node for outputting a switching signal. A duty-cycle of the switching signal has a first non-linear relationship to an amplitude of the time-varying input signal. The switch-mode boost amplifier circuit includes an input voltage node for receiving an input voltage, a switch driver input node coupled to the switching signal output node for receiving the switching signal, and a signal output node for outputting a time-varying output signal. An amplitude of the time-varying output signal has a second non-linear relationship to the duty-cycle of the switching signal, and the time-varying output signal has a linear relationship to the time-varying input signal based on the first non-linear relationship and the second non-linear relationship. The filter circuit includes a filter input node coupled to the signal output node of the switch-mode boost amplifier circuit to receive the time-varying output signal, and a filter output node for outputting a filtered time-varying output signal. The error amplifier circuit has a first input node coupled to the signal input node for receiving the time-varying input signal, and a second input node coupled to the filter output node of the switch-mode boost amplifier circuit to receive the filtered time-varying output signal. The error amplifier circuit produces a feedback control signal using the time-varying input signal and the filtered time-varying output signal, the filtered time-varying output signal being adjusted based on the feedback control signal. The time-varying input signal has a first maximum frequency component, the first maximum frequency component being substantially greater than DC, and the filtered time-varying output signal has a second maximum frequency component, the second maximum frequency component being substantially the same as the first maximum frequency component.

BRIEF DESCRIPTION OF THE DRAWINGS

FIGS. 4A, 4B, 4C, 4D show simplified signal diagrams associated with a high-speed closed-loop switch-mode boost converter, in accordance with some embodiments.

DETAILED DESCRIPTION

Figure 1A:
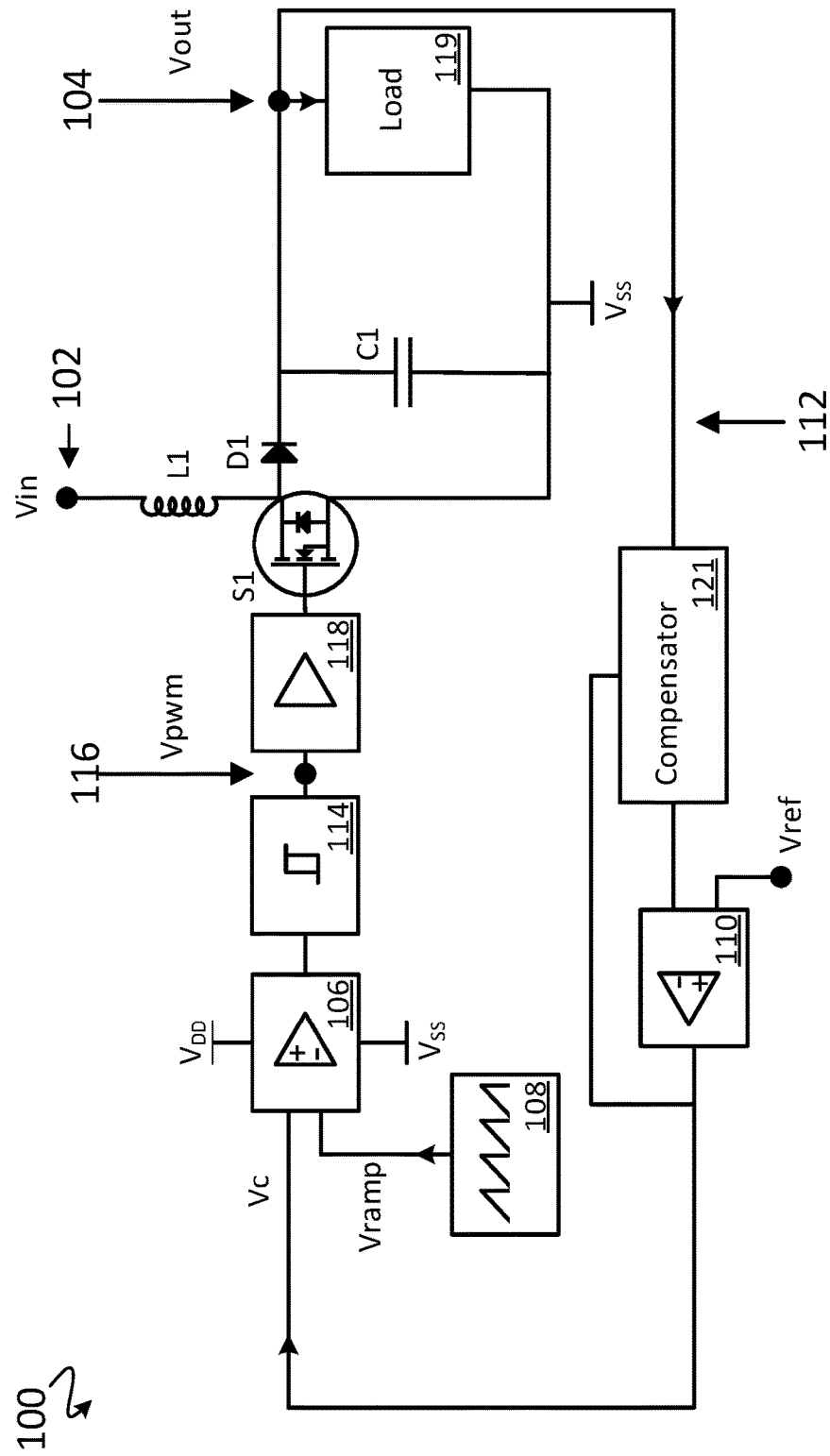
FIG. 1A is a simplified circuit diagram of a prior art switch-mode boost converter.

Some embodiments described herein provide a high-speed closed-loop switch-mode boost ("closed-loop") converter for amplifying a time-varying signal. In some embodiments, the closed-loop converter receives a time-varying input signal and generates a filtered time-varying output signal that advantageously has a substantially linear relationship to the time-varying input signal, and has a maximum frequency component, significantly higher than DC, that is substantially the same as a maximum frequency component of the time-varying input. The closed-loop converter advantageously includes a feedback path to further improve the fidelity with which the time-varying input signal is amplified, and amplifies the time-varying signal without using an intermediate high-voltage rail signal, thereby improving a power efficiency of the closed-loop converter as compared to conventional converters.

In some embodiments, the closed-loop converter generally includes a switching signal generator circuit. The switching signal generator circuit generates a switching signal based on a time-varying input signal. A duty-cycle of the switching signal has a first non-linear relationship to the time-varying input signal. The switching signal drives a switch of a switch-mode boost converter. Based on the switching signal, the switch-mode boost converter generates an amplified time-varying output signal. A second non-linear relationship of the switch-mode boost converter, when "counteracted" by the first non-linear relationship, results in a linear relationship between the time-varying output signal and the time-varying input signal. A high-order (e.g., greater than second-order) filter circuit coupled to an output of the switch-mode boost converter substantially passes frequency components of the time-varying input signal that are present in the time-varying output signal. The high-order filter circuit also substantially attenuates frequencies higher than maximum frequency components of the time-varying input signal that are present in the time-varying output signal. As will be discussed, such embodiments can advantageously simplify and improve the power efficiency of circuits that typically require two or more power converters, such as envelope tracking circuits used in radio frequency (RF) amplifier circuits. A feedback path of the closed-loop converter produces a feedback control signal based on the time-varying input signal and the amplified time-varying output signal. The feedback control signal is received by the switching signal generator circuit of the closed-loop converter to adjust the time-varying output signal such that the time-varying output signal accurately reproduces and amplifies the time-varying input signal while maintaining a linear relationship between the time-varying input signal and the time-varying output signal.

Some conventional systems that amplify a high-bandwidth signal use a first power converter (typically a switch-mode boost power converter) to boost a DC voltage up to a fixed high-voltage rail. The fixed high-voltage rail is used as an input voltage for a second power converter that is capable of amplifying high-bandwidth signals. Such second converters include linear power converters, and in some cases, switch-mode buck converters. The second power converter circuit receives the high-bandwidth signal and steps the input voltage of the high-voltage rail down to generate an amplified form of the high-bandwidth signal. Conventional two-stage amplifiers may produce power efficiency losses due to a voltage difference between the high-voltage rail and the stepped-down amplified signal. Some conventional two-stage amplifiers reduce such power efficiency losses using envelope tracking techniques, in which the high-voltage rail tracks a low frequency component of the time varying input signal. However, power efficiency losses still occur due to a difference in voltage between the high-voltage rail and the amplified output signal.

In instances where the second power converter is a switch-mode buck converter, an output voltage Vout of the converter relates linearly to the input voltage Vin of the converter as a function of a converter switching duty-cycle D, the relationship being:

$$\text{Vout} = D \times \text{Vin} \quad \text{(Equation 1)}.$$

By contrast, the first power converter when implemented as a switch-mode boost power converter has a non-linear relationship between an output voltage Vout of the boost converter and an input voltage Vin of the boost converter as a function of switching duty-cycle D, the relationship being:

$$\text{Vout} = \frac{Vin}{1-D}. \quad \text{(Equation 2)}$$

FIG. 1A shows a simplified circuit diagram of a prior art switch-mode boost power converter ("converter") 100. The converter 100 receives a fixed input voltage Vin at an input voltage node 102 and generates a boosted DC voltage Vout at an output voltage node 104 to provide power to a load 119. The converter 100 generally includes a comparator circuit 106, a ramp generator circuit 108, an error amplifier circuit 110, a pulse generator circuit 114, a switch driver circuit 118, a compensator circuit 121, a switch S1, an inductor L1, an output rectifier (e.g., a diode D1), and a capacitor C1. The converter 100 also generally includes a feedback path 112 that includes the error amplifier circuit 110 and the compensator circuit 121.

The comparator circuit 106 receives a ramp signal Vramp from the ramp generator circuit 108. The comparator circuit 106 performs a comparison between the ramp signal Vramp and a control signal Vc that is received from the error amplifier circuit 110 on the feedback path 112. The compensator circuit 121 is coupled to the error amplifier circuit 110. The error amplifier circuit 110 compares a reference voltage Vref to a (typically) scaled value of the boosted voltage Vout (received from the compensator circuit 121) and amplifies an error between Vref and the scaled value of the boosted voltage Vout to generate the control signal Vc. Comparison results from the comparator circuit 106 are passed to the pulse generator circuit 114 (e.g., a Schmitt Trigger). The pulse generator circuit 114 generates well-defined pulses based on the comparison results (e.g., pulses having a minimum pulse width and clearly defined pulse edges). These pulses form a pulse-width-modulation (PWM) signal Vpwm at signal node 116. The PWM signal Vpwm is received at a switch driver input node of the switch driver circuit 118. The switch driver circuit 118 buffers, level-shifts, or otherwise conditions the PWM signal Vpwm to make a suitable gate drive signal for turning the switch S1 on and off. When the switch S1 is on, the switch S1 conducts current from a high-side of the switch S1 to a low-side of the switch S1. In some designs, the switch S1 is a field-effect-transistor (FET). The high-side of the switch S1 is coupled to the input voltage node 102 through the inductor L1. The low-side of the switch S1 is coupled to a ground node or another bias voltage (e.g., Vss). The high-side of the switch S1 is additionally coupled to the load 119 through the output rectifier, realized in FIG. 1A as the diode D1. The capacitor C1 couples the output voltage node 104 to the ground or other bias voltage node. The capacitor C1 typically filters out non-DC frequency components of the boosted voltage Vout, thereby passing a DC voltage and substantially blocking non-DC frequencies. The boosted voltage Vout is received at the load 119.

Figure 1B:
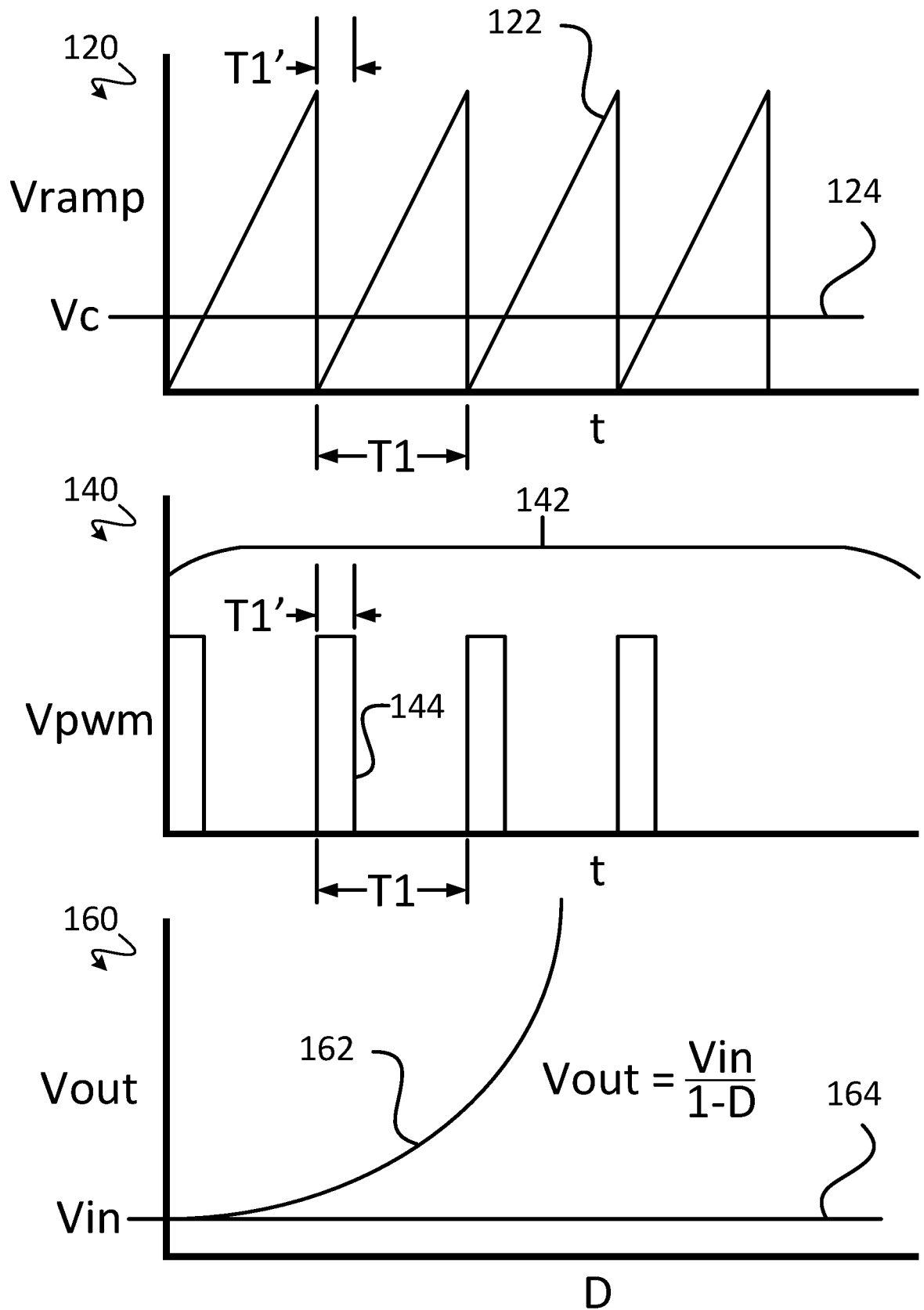
FIG. 1B shows simplified signal diagrams associated with a prior art switch-mode boost converter.

As was discussed with reference to Equation 2, Vout relates non-linearly to Vin as a function of a duty-cycle D of the PWM signal Vpwm. A simplified signal diagram 120 of FIG. 1B shows a ramp signal Vramp 122 and a control signal Vc 124 received at the comparator circuit 106 of FIG. 1A over time t. A simplified signal diagram 140 of FIG. 1B shows a PWM signal Vpwm 142 generated from the ramp signal Vramp 122 and the control signal Vc 124 via the comparator circuit 106 and the pulse generator circuit 114. In the example shown, the control signal Vc 124 is shown as constant over time t for simplicity. However, it is understood that the control signal Vc 124 can change over time.

The ramp signal Vramp 122, and by extension the PWM signal Vpwm 142, are shown to have a period T1. A duration of time that the ramp signal Vramp 122 is below the control signal Vc 124 is designated as duration T1'. The comparator circuit 106 of FIG. 1A outputs a comparison value that is positive when the control signal Vc 124 is greater than the ramp signal Vramp 122 and negative (or zero) when the control signal Vc 124 is less than the ramp signal Vramp 122. The pulse generator circuit 114 receives the comparison value and generates pulses (e.g., 144) based on the received comparison value. Accordingly, a pulse width of the pulse 144 is also of duration T1'. The ratio of the pulse duration T1' to the period T1 is the duty-cycle D of the PWM signal Vpwm 142 for that period. As shown in Equation 2, for a fixed input voltage Vin, the boosted output voltage Vout increases and decreases non-linearly as the duty-cycle D increases and decreases, respectively. This non-linear relationship is illustrated in a simplified signal diagram 160 of FIG. 1B. As shown, the boosted output voltage Vout 162 is a non-linear function of the duty-cycle D of the PWM signal Vpwm 142 for a fixed input voltage Vin 164.

Figure 2A:
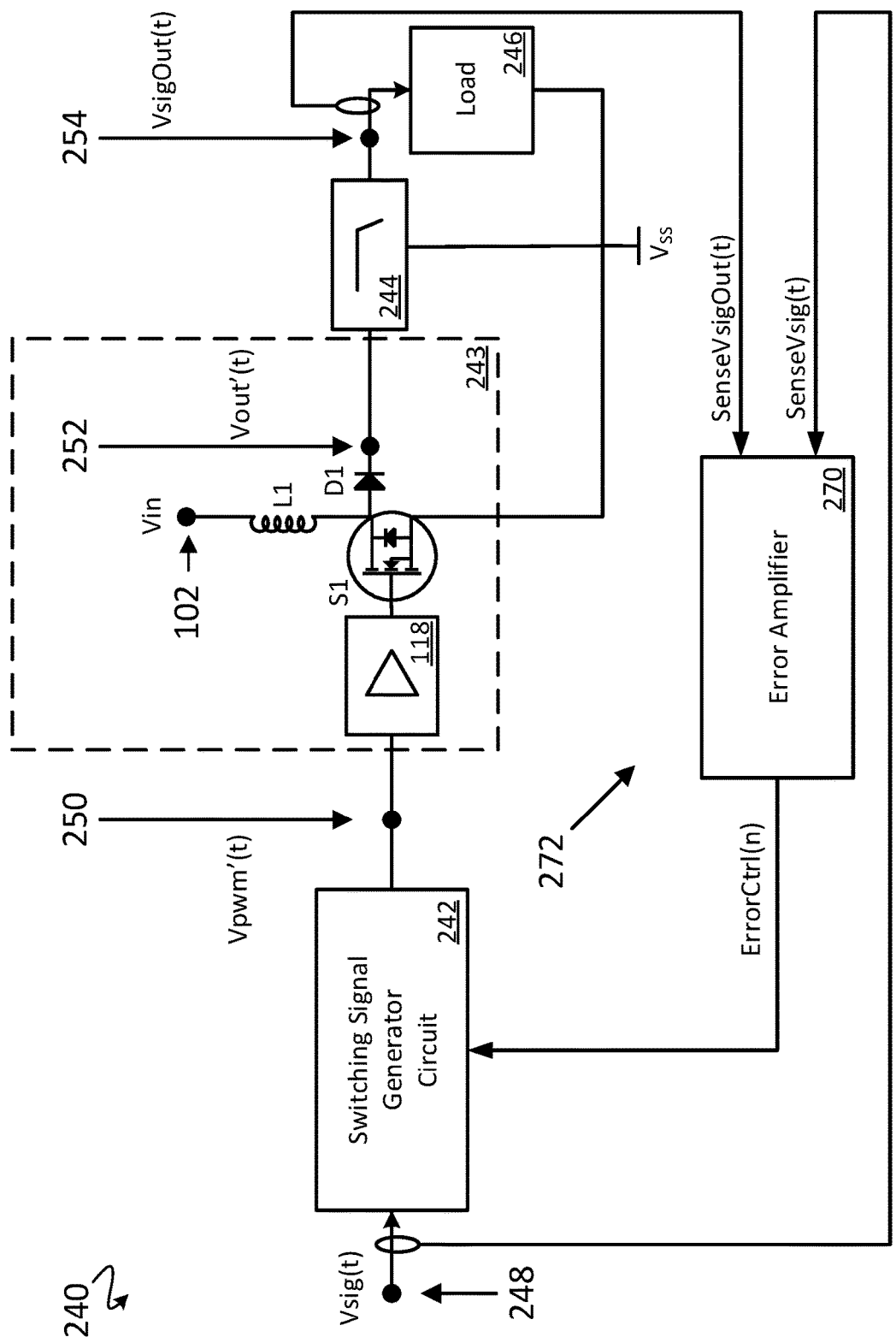
FIGS. 2A, 2B are simplified circuit diagrams of high-speed closed-loop switch-mode boost converters, in accordance with some embodiments.

FIG. 2A illustrates a simplified circuit diagram of a high-speed closed-loop switch-mode boost converter ("closed-loop converter") 240 with linear signal characteristics, in accordance with some embodiments. Like-numbered elements of the closed-loop converter 240 may have similar descriptions as corresponding like-numbered elements of the converter 100 of FIG. 1A, although design considerations may cause actual implementations of these elements to be rendered differently in the two circuits. Some elements of the closed-loop converter 240 have been omitted from FIG. 2A to simplify the description of the closed-loop converter 240 but are understood to be present.

In general, the closed-loop converter 240 includes a switching signal generator circuit 242, a switch-mode boost amplifier ("amplifier") circuit portion 243, a filter circuit 244 to provide power to a load 246, and an error amplifier circuit 270 on a feedback path 272 of the closed-loop converter 240. The amplifier circuit portion 243 generally includes the input voltage node 102, the switch driver circuit 118, the switch S1, the inductor L1, a signal output node 252, and an output rectifier realized here as the diode D1. In some embodiments, the switch S1 is a power FET. For example, in some embodiments, the switch S1 is an n-FET or a p-FET. In some embodiments, the switch driver circuit 118 is part of the switching signal generator circuit 242.

A first input of the error amplifier circuit 270 is coupled to a signal input node 248 of the closed-loop converter 240, a second input of the error amplifier circuit 270 is coupled to a signal output node 254 (i.e., a filter output node) of the closed-loop converter 240, and an output of the error amplifier circuit 270 is coupled to the switching signal generator circuit 242. In some embodiments, the error amplifier circuit 270 includes a compensator circuit (not shown) that is similar to, or the same as the compensator circuit 121.

The switching signal generator circuit 242 receives a time-varying input signal Vsig(t) at the signal input node 248 and generates a switching signal Vpwm'(t) at an output node 250. A duty-cycle of the switching signal Vpwm'(t) has a non-linear relationship to an amplitude of the time-varying input signal Vsig(t). In some embodiments, the relationship of amplitude to duty-cycle is described as:

$$D(t) = 1 - \frac{K}{Vsig(t)},\qquad\text{(Equation 3)}$$

where D(t) is a duty-cycle of the switching signal Vpwm'(t) that varies over time t in accordance with an amplitude of the time-varying input signal Vsig(t), and K is a constant. The time-varying input signal Vsig(t) is a signal that has rising and falling amplitudes which vary over time, resulting in frequency components that are substantially greater than DC. In some embodiments a signal bandwidth $Vsig_{BW}$, or a maximum frequency component fMAX(Vsig(t)), of the time-varying input signal Vsig(t) is 20 Hz-20 kHz. In other embodiments, the signal bandwidth $Vsig_{BW}$ or the maximum frequency component fMAX(Vsig(t)) is greater than 1 MHz, greater than 10 MHz, and in some embodiments, is on the order of 100 MHz. In some embodiments, the time-varying input signal Vsig(t) is a sinusoid. In some embodiments, the time-varying input signal Vsig(t) is a modulated sinusoid. In some embodiments, the time-varying input signal Vsig(t) is a signal having a time-varying amplitude having frequency content up to and including fMAX(Vsig(t)). In some embodiments, the time-varying input signal Vsig(t) is an audio signal. In some embodiments, the time-varying input signal Vsig(t) is an envelope signal. In some embodiments, the time-varying input signal Vsig(t) is a communication signal, or another signal suitable for amplification.

The switch driver circuit 118 receives the switching signal Vpwm'(t) at a switch driver input node and generates a suitable gate driver signal (as described with reference to FIG. 1A) for turning the switch S1 on and off in accordance with Vpwm'(t) to generate a boosted time-varying output signal Vout'(t) at the signal output node 252. The time-varying output signal Vout'(t) has a non-linear relationship to the duty-cycle D(t) of the switching signal Vpwm'(t) (similar to that of Equation 2), expressed here as:

$$Vout'(t) = \frac{Vin}{1 - D(t)}.\qquad\text{(Equation 4)}$$

Thus, by substituting the first non-linear relationship for duty-cycle D(t) as shown in Equation 3 into the second non-linear relationship for the time-varying output signal Vout'(t) of Equation 4, it is shown that a linear relationship between the time-varying input signal Vsig(t), the time-varying output signal Vout'(t), and a filtered time-varying output signal VsigOut(t) is advantageously achieved. This linear relationship can be expressed as:

$$VsigOut(t)=K'+Vsig(t)+Vin\qquad\text{(Equation 5)},$$

where constant K' includes the constant K and the constant input voltage Vin.

The filter circuit 244 receives the time-varying output signal Vout'(t) at a filter input node (i.e., the signal output node 252) and substantially filters out frequency components that are greater than the signal bandwidth $Vsig_{BW}$ or a maximum frequency component fMAX(Vsig(t)), of the time-varying input signal Vsig(t) (e.g., switching frequencies and harmonics thereof). The filter circuit 244 outputs the filtered time-varying output signal VsigOut(t) at a filter output node (i.e., the signal output node 254). The filtered time-varying output signal VsigOut(t) is received at the load 246. The filtered time-varying output signal VsigOut(t) advantageously has a signal bandwidth that is substantially the same as the signal bandwidth of the input signal Vsig(t) and has a maximum frequency component fMAX(VsigOut(t)) that is the same as a maximum frequency component fMAX(Vsig(t)) of the time-varying input signal Vsig(t). That is, Vsig(t) and VsigOut(t) both include a range of frequency components, ranging from a minimum frequency component to a maximum frequency component, the ranges being substantially the same. This contrasts with the converter 100, which due to the capacitor C1, substantially filters out non-DC frequency components of Vout.

The error amplifier circuit 270 receives a first time-varying sense signal SenseVsig(t) from the signal input node 248 and a second time-varying sense signal SenseVsigOut(t) from the signal output node 254 (i.e., a filter output node) and uses one or both of the first sense signal SenseVsig(t)

and/or the second sense signal SenseVsigOut(t) to produce a time-varying feedback control signal ErrorCtrl(n) that is received by the switching signal generator circuit 242. The first sense signal SenseVsig(t) is representative of one or both of a voltage level and/or a current level sensed (e.g., using an analog to digital converter (ADC) or using an analog circuit) at the signal input node 248. Similarly, the second sense signal SenseVsigOut(t) is representative of one or both of a voltage level and/or a current level sensed (e.g., using an ADC or using an analog circuit) at the signal output node 254. In some embodiments, the error amplifier circuit 270 includes a compensator circuit (not shown) that is similar to the compensator circuit 121, and the second sense signal SenseVsigOut(t) is a signal that is output from the compensator circuit. The error amplifier circuit 270 compares the second sense signal SenseVsigOut(t), or a signal that is based on the second sense signal (e.g., a scaled, buffered, filtered, phase-shifted, or otherwise compensated signal), to a reference signal that is, or is based on, the first sense signal SenseVsig(t) (e.g., a scaled signal, buffered, phase-shifted, or filtered signal) to generate the feedback control signal ErrorCtrl(n). In some embodiments, the feedback control signal ErrorCtrl(n) is a time-varying digital signal. In other embodiments, the feedback control signal ErrorCtrl(n) is a time-varying analog signal.

The feedback control signal ErrorCtrl(n) is received by the switching signal generator circuit 242 to ultimately adjust an output level of the filtered time-varying output signal VsigOut(t) produced at the signal output node 254 such that the filtered time-varying output signal VsigOut(t) accurately produces (i.e., with high fidelity) an amplified version of the time-varying input signal Vsig(t). By the inclusion of the feedback path 272, residual errors (e.g., non-linearities) that remain after linearization performed by the switching signal generator circuit 242 are advantageously corrected, though a maximum bandwidth of the closed-loop converter 240 may be lower than that of an open-loop converter that performs linearization using the switching signal generator circuit 242.

In some embodiments, at least the switching signal generator circuit 242, the switch driver circuit 118, the error amplifier circuit 270, and the switch S1 are integrated into a signal integrated circuit (IC) package. In some embodiments, an IC package includes a semiconductor device that integrates multiple circuit elements of the closed-loop converter 240. In some embodiments, the semiconductor device includes a substrate and an active layer formed on a monolithic substrate. The active layer includes all or part of the switching signal generator circuit 242, all or part of the switch driver circuit 118, all or part of the error amplifier circuit 270, and includes the switch S1. In some embodiments, the active layer is formed using silicon (Si). In some embodiments, the active layer is formed using silicon carbide (SiC). In other embodiments, the active layer is formed using other materials known in the art.

Figure 2B:
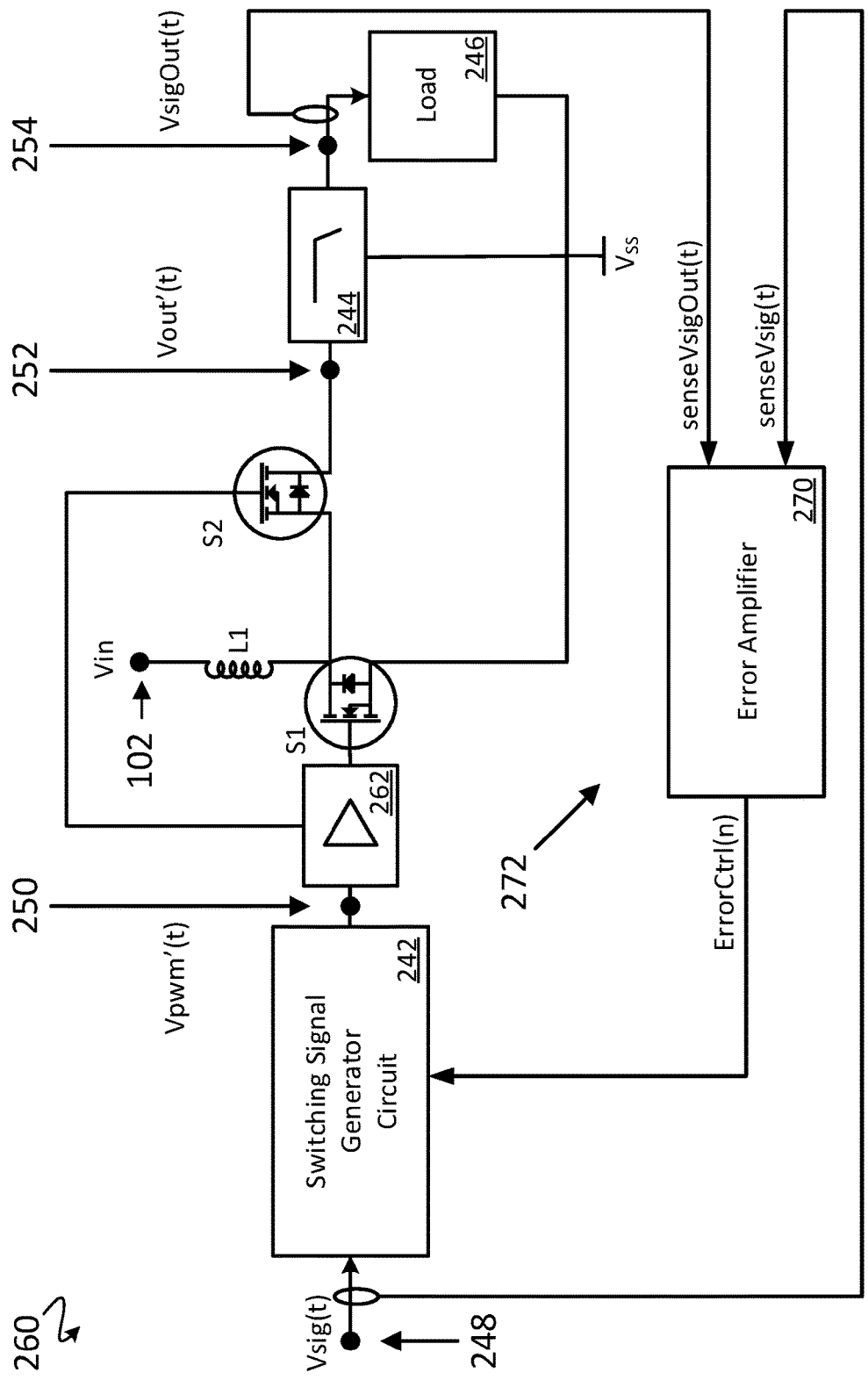

FIG. 2B illustrates a simplified circuit diagram of a high-speed, closed-loop switch-mode boost converter ("closed-loop converter") 260 with linear signal characteristics, in accordance with some embodiments where a synchronous switch S2 is used as the output rectifier in lieu of the diode D1. The closed-loop converter 260 generally includes like-numbered elements as shown and described with reference to FIG. 2A. A switch driver circuit 262 is shown to have a second signal output coupled to a gate node of the switch S2 to, in general, synchronously turn the switch S2 on when the switch S1 is turned off and turn the switch S2 off when the switch S1 is turned on. As is known in the art, replacing a diode output rectifier with a synchronously switched output rectifier can increase system power efficiency.

Figure 3A:
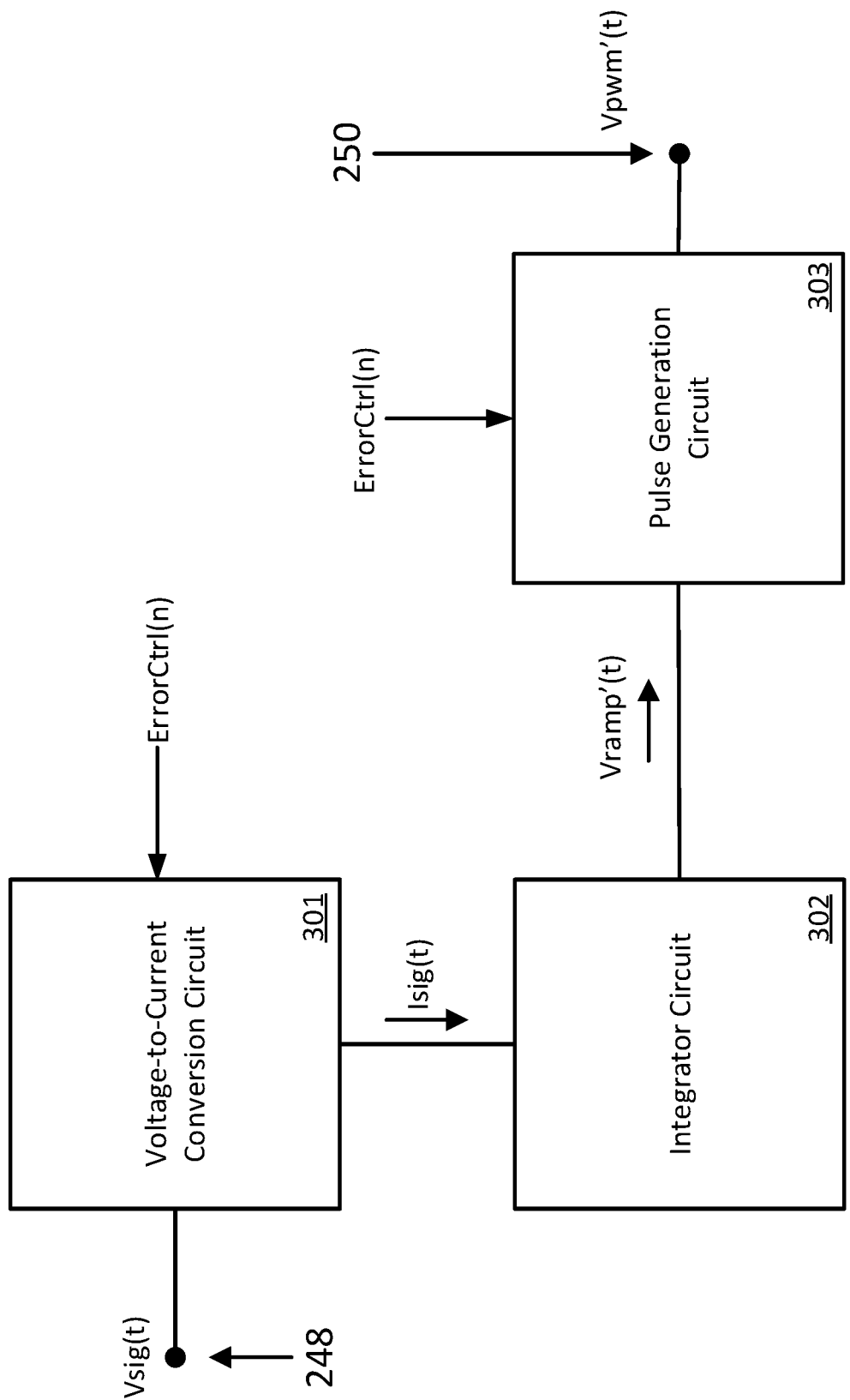
FIGS. 3A, 3B, 3C, 3D are simplified circuit diagrams providing details of switching signal generator circuits of a high-speed closed-loop switch-mode boost converter, in accordance with some embodiments.

FIG. 3A illustrates a simplified circuit diagram of an example embodiment of a switching signal generator circuit 342, in accordance with some embodiments. In some embodiments, the switching signal generator circuit 242 shown in FIG. 2A and/or FIG. 2B is realized as the switching signal generator circuit 342. In general, the switching signal generator circuit 342 generates a time-varying ramp signal Vramp'(t) which is used to generate the switching signal Vpwm'(t). The ramp signal Vramp'(t) relates non-linearly to the time varying input signal Vsig(t). Each ramp peak of the ramp signal Vramp'(t) may substantially vary in amplitude from one or more other peaks of the ramp signal Vramp'(t). By comparison, conventional ramp generator circuits typically generate a conventional ramp signal where each ramp peak is of substantially the same amplitude as the other ramp peaks of the conventional ramp signal.

The switching signal generator circuit 342 generally includes a voltage-to-current conversion circuit portion 301, an integrator circuit portion 302, and a pulse generation circuit portion 303. The voltage-to-current conversion circuit portion 301 receives the time varying input signal Vsig(t) at the signal input node 248 and produces a charging current flow Isig(t) based on time varying input signal Vsig(t). The integrator circuit portion 302 receives the charging current flow Isig(t) and generates the time-varying ramp signal Vramp'(t) based on the charging current flow Isig(t). The pulse generation circuit portion 303 receives the time-varying ramp signal Vramp'(t) and generates the switching signal Vpwm'(t) at the output node 250 based on the time-varying ramp signal Vramp'(t), the switching signal Vpwm'(t) having a duty-cycle D(t) in accordance to Equation 3. In other embodiments, the switching signal generator circuit 242/342 includes other circuit portions (not shown) suitable for generating the switching signal Vpwm'(t) having a duty-cycle D(t) in accordance with Equation 3.

In some embodiments, the voltage-to-current conversion circuit portion 301 and/or the pulse generation circuit portion 303 are operable to receive the feedback control signal ErrorCtrl(n) from the error amplifier circuit 270 and to adjust the time-varying current Isig(t) and/or a trigger voltage level of a comparator based on values of the feedback control signal ErrorCtrl(n) to produce the switching signal Vpwm'(t) such that a high-fidelity amplified time-varying output signal is generated.

Figure 3B:
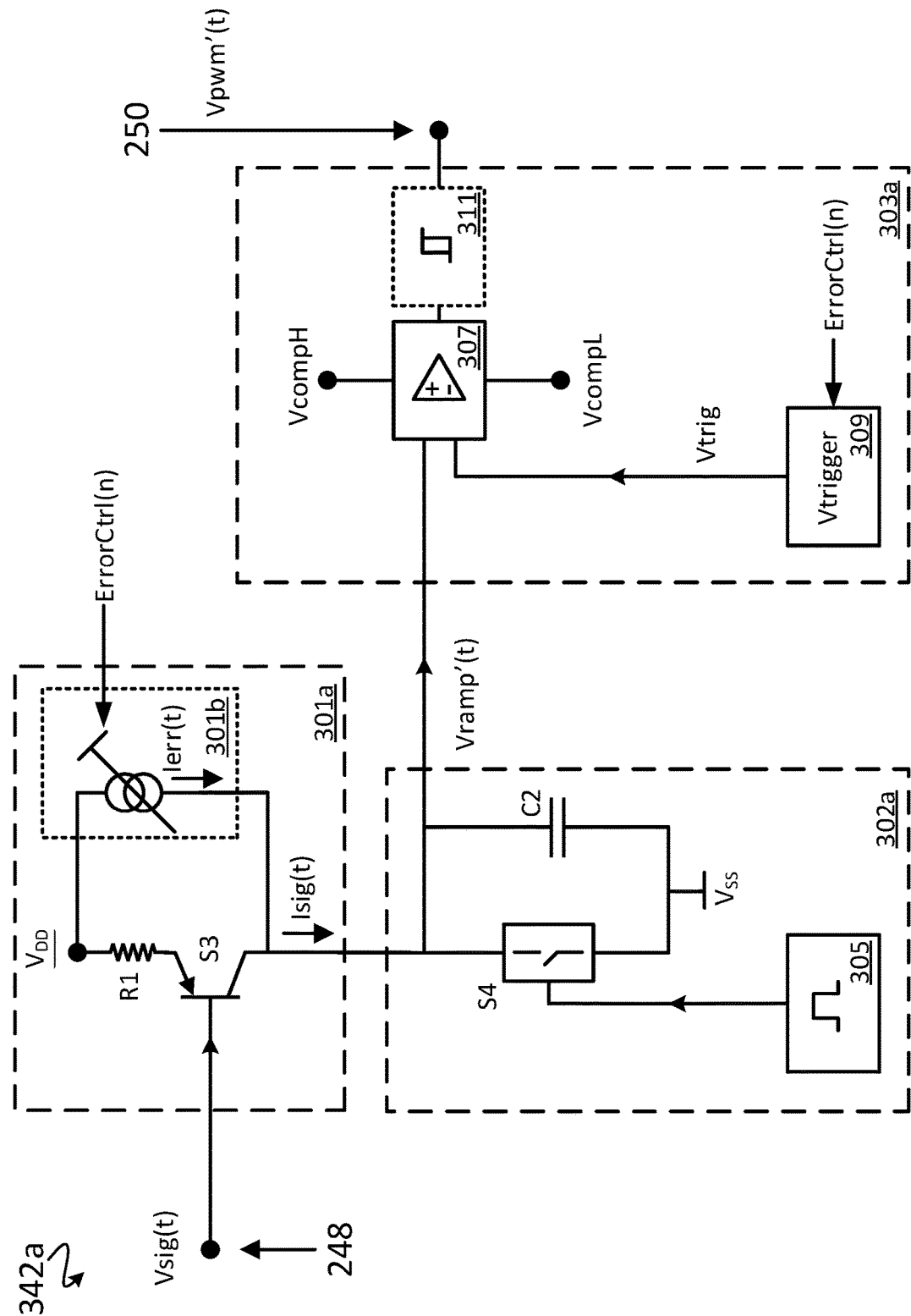

FIG. 3B illustrates a simplified circuit diagram of a first example embodiment of a switching signal generator circuit 342a, in accordance with some embodiments. In some embodiments, the switching signal generator circuit 242 shown in FIG. 2A and/or FIG. 2B is realized as the switching signal generator circuit 342a. In the example embodiment shown, the switching signal generator circuit 342a includes a voltage-to-current conversion circuit portion 301a, an integrator circuit portion 302a, and a pulse generation circuit portion 303a. These circuit portions 301a, 302a, 303a, given the time-varying input signal Vsig(t) received from the signal input node 248, generate the switching signal Vpwm'(t) having a duty-cycle D(t) in accordance to Equation 3.

In the embodiment shown, the example voltage-to-current conversion circuit portion 301a generally includes an optional adjustable current source circuit 301b, as well as a switch S3. The switch S3 is coupled to a positive voltage node Vdd through a resistor R1. In some embodiments, the switch S3 is a field-effect-transistor (FET). In some embodiments, the switch S3 is an n-FET, a p-FET or a bi-polar junction transistor (BJT). Other voltage-to-current conversion circuit portions suitable for generating a time-varying current based on a received time-varying voltage signal, a time varying digital signal, or a static digital signal, as are known in the art, could be used for the voltage-to-current conversion portions described herein.

The integrator circuit portion 302a generally includes a capacitor C2 coupled between the voltage-to-current conversion circuit portion 301a and a ground node (or another bias voltage Vss), a switch S4 (i.e., a discharge switch) coupled in parallel to the capacitor C2, and a switch control circuit 305 coupled to a switch control node of the switch S4.

The pulse generation circuit portion 303a generally includes a comparator circuit 307 (i.e., a voltage comparison circuit similar to the comparator circuit 106), a trigger level generation circuit 309, and an optional pulse-generator circuit 311. A first input of the comparator circuit 307 is coupled to the capacitor C2, and a second input of the comparator circuit 307 is coupled to a trigger level generation circuit 309. The comparator circuit 307 is powered between a high voltage rail VcompH and a low voltage rail VcompL. An output of the comparator circuit 307 is coupled to an input of the pulse-generator circuit 311 (which is similar to the pulse generator circuit 114). In some embodiments, the high voltage rail VcompH is Vdd and the low voltage rail VcompL is the ground node (or the other bias voltage Vss). In some embodiments, the comparator circuit 307 is suitable for generating well-defined pulses and the pulse-generator circuit 311 is optional. In some embodiments, the bias voltage node Vss is a ground node. In some embodiments, the bias voltage node Vss is another bias voltage. The trigger level generation circuit 309 is optionally configured to receive the feedback control signal ErrorCtrl (n) and to adjust (i.e., raise or lower) a level of a trigger voltage Vtrig produced by the trigger level generation circuit 309 based on a value of the feedback control signal ErrorCtrl (n) (e.g., using a digital to analog converter (DAC) or an analog circuit).

When driven at a current conduction control node (e.g., a gate or body node) by the time-varying input signal Vsig(t), the switch S3 provides the proportional time-varying current Isig(t) to the integrator circuit portion 302a. In the embodiment shown, an amplitude of the time-varying current Isig(t) is 180 degrees out of phase with the time-varying input signal Vsig(t). In other embodiments (e.g., as shown in FIG. 3D), the time-varying current Isig(t) is in phase with the time-varying input signal Vsig(t). The ramp signal Vramp' (t) is generated by the integrator circuit portion 302a. The time-varying current Isig(t) charges the capacitor C2 of the integrator circuit portion 302a. The switch S4, when triggered by the switch control circuit 305 such that the switch S4 is in a conduction state, discharges the capacitor C2 through the switch S4 to the ground voltage node via a discharge current flow. A value of the capacitor C2 and a switch rate of the switch S4 are chosen for a corresponding voltage-to-current conversion circuit portion 301a such that a frequency of the resultant ramp signal Vramp'(t) is at least two times greater than a maximum frequency of the time-varying input signal Vsig(t), thereby producing a switching frequency of the switching signal Vpwm'(t) that is at least two times greater than a maximum frequency of the time-varying input signal Vsig(t). The frequency of the ramp signal Vramp'(t) can be selected at design time through the realization of the voltage-to-current conversion circuit portion 301a, a chosen capacitance value of the capacitor C2, a discharge frequency/period of the switch S4 as driven by the switch control circuit 305, and a discharge duty-cycle of the switch S4 as driven by the switch control circuit 305. In some embodiments, the discharge frequency/discharge period of the switch S4 is set to be equal to, or greater than, a time duration to fully discharge the capacitor C2 to the ground node when the switch S4 is conducting. In the example shown in FIG. 3B, amplitudes of the time-varying input signal Vsig(t) are 180-degrees out of phase with corresponding amplitudes of a generated ramp signal Vramp'(t). That is, the integrator circuit portion 302a as shown generates a ramp signal Vramp'(t) having maximum ramp peak amplitudes that correspond to minimum amplitudes of the time-varying input signal Vsig(t) and minimum ramp peak amplitudes that correspond to maximum amplitudes of the time-varying input signal Vsig(t).

The comparator circuit 307 receives the ramp signal Vramp'(t) at a first input and compares amplitudes of the ramp signal Vramp'(t) to an amplitude of the trigger voltage Vtrig received from the trigger level generation circuit (Vtrigger) 309. Comparison results from the comparator circuit 307 are passed to the pulse-generator circuit 311. The pulse-generator circuit 311 generates well-defined pulses based on the comparison results. These pulses form the switching signal Vpwm'(t) at the output node 250.

In some embodiments, elements of the circuit portions 301a, 302a are selected to generate a Vramp'(t) signal having a maximum ramp peak amplitude (i.e., a maximum ramp voltage) that is equal to, or slightly less, than the high voltage rail VcompH (i.e., an upper voltage comparison limit) of the comparator circuit 307 and a minimum ramp peak amplitude (i.e., a minimum ramp voltage) that is equal to, or slightly greater, than the low voltage rail VcompL of the comparator circuit 307 (i.e., a lower voltage comparison limit). In some embodiments, the amplitude of the trigger voltage Vtrig is set at design time to be greater than zero and less than or equal to a minimum ramp peak amplitude of the ramp signal Vramp'(t). In some embodiments, the trigger voltage Vtrig is set to be a fixed percentage of a voltage rail of the comparator circuit 307. In other embodiments, the trigger voltage Vtrig is based on a difference between the high voltage rail VcompH and the low voltage rail VcompL. In yet other embodiments, such as one discussed below with reference to FIG. 3C, an amplitude of the trigger voltage Vtrig is determined during operation of the closed-loop converter 240/260. In some embodiments, the trigger voltage Vtrig is adjusted (e.g., raised or lowered) relative to a fixed value based on the feedback control signal ErrorCtrl (n).

In some embodiments, the optional adjustable current source circuit 301b is operable to generate an error current Ierr(t) having a current level that is adjusted based on values of the feedback control signal ErrorCtrl(n). The error current Ierr(t) contributes to a current level of the current Isig(t) to control a rate at which the capacitor C2 is charged by the voltage-to-current conversion circuit portion 301a. By adjusting the rate at which the capacitor C2 is charged, the feedback control signal ErrorCtrl(n) is operable to adjust the duty cycle of the switching signal Vpwm'(t) to thereby adjust an output level of the filtered time-varying output signal VsigOut(t) of the closed-loop converter 240/260 in response to a determined difference between the filtered time varying output signal VsigOut(t) and a time varying reference signal that is based on the time-varying input signal Vsig(t). Similarly, in some embodiments, the trigger level generation circuit (Vtrigger) 309 is operable to receive the feedback control signal ErrorCtrl(n) and adjust a level of the trigger voltage Vtrig relative to a fixed value based on the feedback control signal ErrorCtrl(n) to adjust the duty cycle of the switching signal Vpwm'(t) to thereby adjust an output level of the filtered time-varying output signal VsigOut(t) of the closed-loop converter 240/260. By adjusting the output level of the filtered time-varying output signal VsigOut(t) of the closed-loop converter 240/260 using the feedback control signal ErrorCtrl(n), fidelity of a signal amplified by the closed-loop converter 240/260 is advantageously higher than a signal amplified by a conventional converter.

Figure 3C:
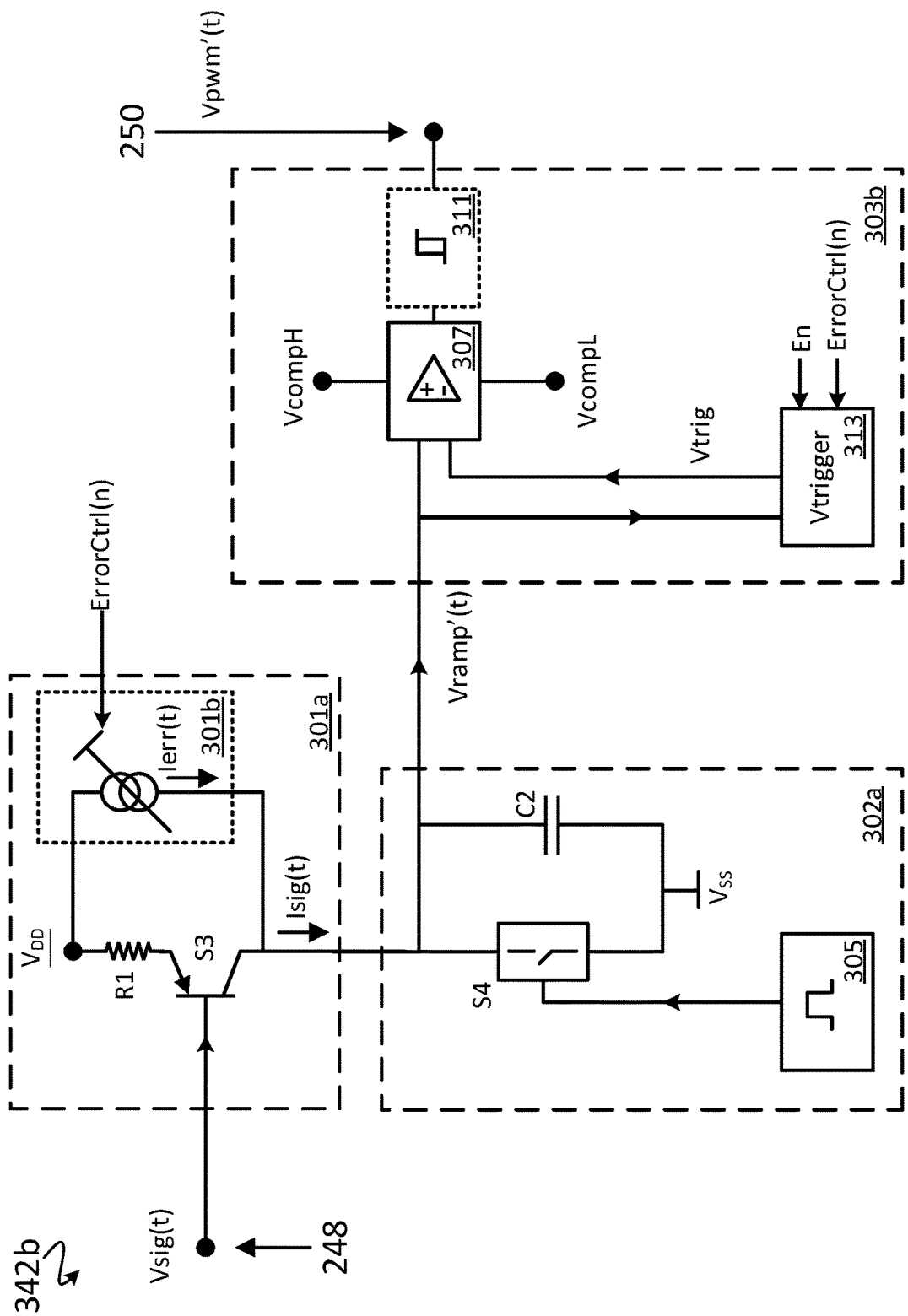
Figure 3D:
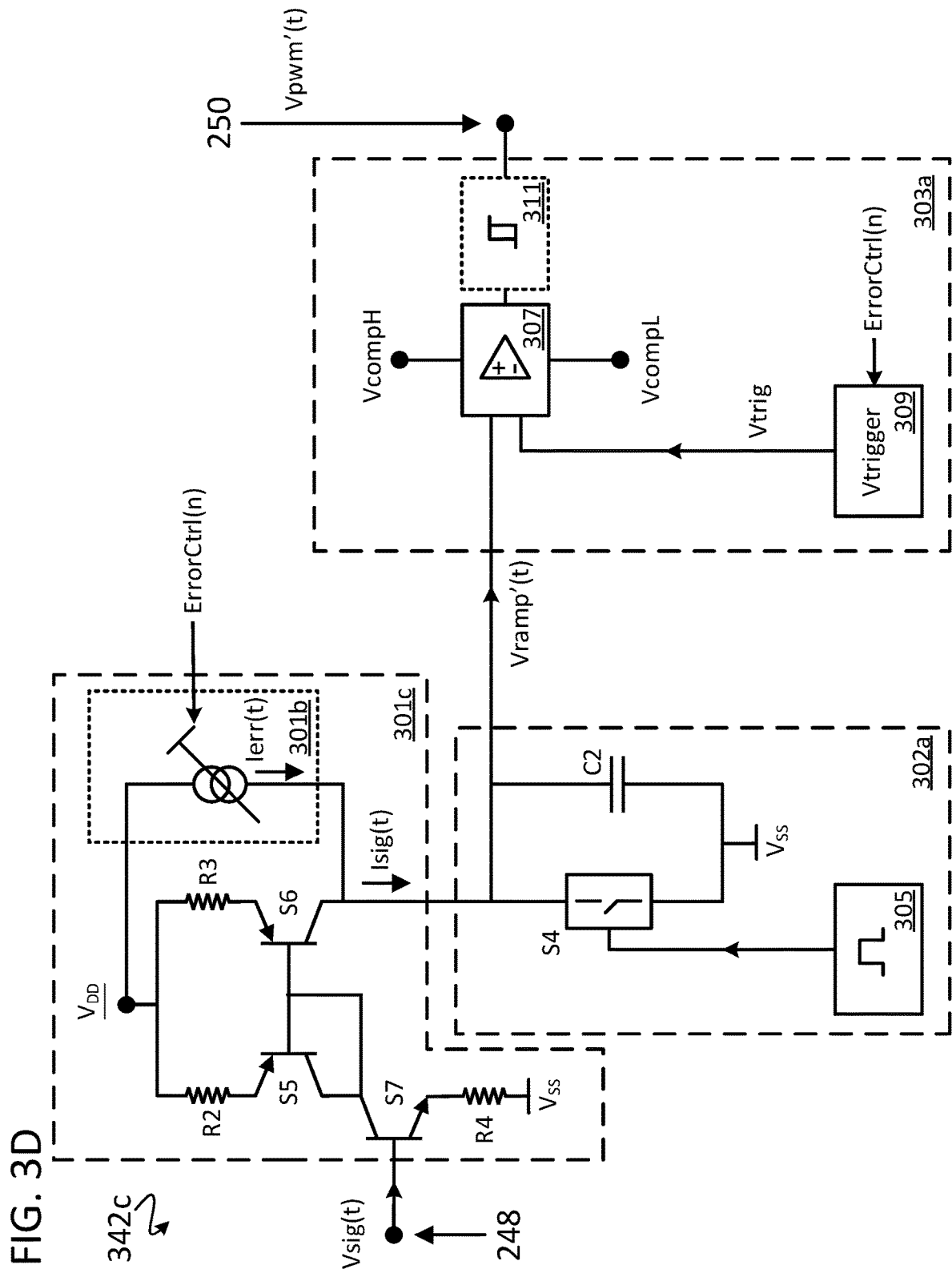

FIG. 3C illustrates a simplified circuit diagram of an example embodiment of a switching signal generator circuit 342b, in accordance with some embodiments. In some embodiments, the switching signal generator circuit 242 shown in FIG. 2A/2B is realized as the switching signal generator circuit 342b. The switching signal generator circuit 342b generally includes the voltage-to-current conversion circuit portion 301a, the integrator circuit portion 302a, and a pulse generation circuit portion 303b. Like-numbered circuit elements correspond to like-numbered circuit elements shown and discussed with reference to FIG. 3B. In the embodiment shown, a trigger level generation circuit (Vtrigger) 313 is coupled to the capacitor C2 to receive the ramp signal Vramp'(t). The trigger level generation circuit 313 detects a minimum ramp peak voltage amplitude and generates a trigger voltage Vtrig having an amplitude that is greater than zero and equal to, or less than, the detected minimum ramp peak voltage amplitude. Thus, rather than being set to an arbitrary amplitude, or the amplitude being set at design time, the amplitude of the trigger voltage Vtrig advantageously corresponds to a specific amplitude of the ramp signal Vramp'(t). In some embodiments, the detection occurs when an external control signal En is received by the trigger level generation circuit 313 (e.g., from a control circuit or a reset control circuit, not shown). In some embodiments, the amplitude of the trigger voltage Vtrig that corresponds to a specific amplitude of the ramp signal Vramp'(t) is further adjusted based on values of the feedback control signal ErrorCtrl(n).

FIG. 3D illustrates a simplified circuit diagram of an example embodiment of a switching signal generator circuit 342c, in accordance with some embodiments. In some embodiments, the switching signal generator circuit 242 shown in FIG. 2A/2B is realized as the switching signal generator circuit 342c. The switching signal generator circuit 342c generally includes a voltage-to-current conversion circuit portion 301c, the integrator circuit portion 302a, and the pulse generation circuit portion 303a (or the pulse generation circuit portion 303b shown in FIG. 3C). Like-numbered circuit elements correspond to like-numbered circuit elements shown and discussed with reference to FIG. 3B. In the embodiment shown, the voltage-to-current conversion circuit portion 301c is realized using a current-mirror topology, the circuit portion 301c generally including the optional adjustable current source circuit 301b, resistors R2-4 and switches S5-7, coupled as shown. In some embodiments, any of the switches S5-S7 can be an n-FET, a p-FET, an n-type power FET, a BJT, or a p-type power FET.

In the example shown, amplitudes of the time-varying input signal Vsig(t) are in phase with corresponding amplitudes of the generated ramp signal Vramp'(t). That is, the integrator circuit portion 302a generates a ramp signal Vramp'(t) having maximum ramp peak amplitudes that correspond in time to maximum amplitudes of the time-varying input signal Vsig(t) and minimum ramp peak amplitudes that correspond in time to minimum amplitudes of the time-varying input signal Vsig(t).

This correspondence is further illustrated in simplified signal diagram 470 FIG. 4A, which shows a ramp signal Vramp'(t) 474 and a trigger voltage Vtrig 476 received at the comparator circuit 307 (of FIG. 3D) over time t. The ramp signal Vramp'(t) 474 is generated based on a time-varying input signal Vsig(t) 472 received at the signal input node 248. In the example shown, maximum peak amplitudes of the ramp signal Vramp'(t) 474 correspond to maximum amplitudes of the time-varying input signal, Vsig(t) 472. Minimum peak amplitudes of the ramp signal Vramp'(t) 474 correspond to minimum amplitudes of the time-varying input signal, Vsig(t) 472. Thus, Vsig(t) 472 and Vramp'(t) 474 are in phase. As shown, an amplitude of the trigger voltage Vtrig 476 is equal to or less than a minimum peak amplitude of the ramp signal Vramp'(t) 474. In some embodiments, as was discussed with reference to FIG. 3B, the amplitude of the trigger voltage Vtrig 476 is set at design time. In other embodiments, as was discussed with reference to FIG. 3C, the amplitude of the trigger voltage Vtrig 476 is set based a determination of a minimum generated peak amplitude of the ramp signal Vramp'(t) 474. In some embodiments, the amplitude of the trigger voltage Vtrig 476 is adjusted based on values of the feedback control signal ErrorCtrl(n).

A simplified signal diagram 480 of FIG. 4A shows a switching signal Vpwm'(t) 482 that corresponds to the relationship between the ramp signal Vramp'(t) 474 and the trigger voltage Vtrig 476. In contrast to the control signal Vc 124 as described with reference to FIG. 1B, in some embodiments the trigger voltage Vtrig 476 does not change over time t. In other embodiments, the trigger voltage Vtrig 476 does not change over time t, with the exception of adjustments made to the trigger voltage Vtrig 476 based on values of the feedback control signal ErrorCtrl(n). In embodiments similar to that of FIG. 3C, a new amplitude of trigger voltage Vtrig 476 can be generated if the enable signal En is triggered again. In such embodiments, an amplitude of the trigger voltage Vtrig 476 may still be adjusted by the trigger level generation circuit 309 based on the feedback control signal ErrorCtrl(n) received by the trigger level generation circuit 309 from the error amplifier circuit 270.

The ramp signal Vramp'(t) 474, and by extension the switching signal Vpwm'(t) 482, are shown to have a period T2. An example duration of time that the ramp signal Vramp'(t) 474 is greater than the trigger voltage Vtrig 476 is designated as duration T2'. The comparator circuit 307, in some embodiments, outputs a positive value when an amplitude of the ramp signal Vramp'(t) 474 is greater than the trigger voltage Vtrig 476. The pulse-generator circuit 311 receives the comparison value and generates pulses (e.g., 484) based on the received comparison value. Accordingly, a pulse width of the pulse 484 is also of duration T2'. The ratio of the pulse duration T2' to the period T2 is the duty-cycle D(t) of the switching signal Vpwm'(t) for that period. This time-varying duty-cycle D(t) of the switching signal Vramp'(t) is in accordance with Equation 3.

As shown in the simplified signal diagram 490 of FIG. 4A, by substituting the first non-linear relationship for duty-cycle D(t) as shown in Equation 3 into the second non-linear relationship for the time-varying output signal Vout'(t) of Equation 4, it is shown that a linear relationship 492 between the time-varying input signal Vsig(t) and the filtered time-varying output signal VsigOut(t) is advantageously achieved.

In some embodiments, the period T2 of the ramp signal Vramp'(t) is selected such that a frequency of the ramp signal Vramp'(t), and thereby that of the switching signal Vpwm'(t), is two or more times greater than one or both of a maximum frequency component fMAX(Vsig(t)) or signal bandwidth VsigBW of the time-varying input signal Vsig(t). In some embodiments, the period T2 of the ramp signal Vramp'(t) is selected such that a frequency of the ramp signal Vramp'(t), and thereby that of the switching signal Vpwm'(t), is eight or more times greater than one or both of the maximum frequency component fMAX(Vsig(t)) or signal bandwidth VsigBW of the time-varying input signal Vsig(t).

In some embodiments, a slope of the ramp signal Vramp'(t) 474 is adjusted using the error current Ierr(t) generated by the adjustable current source circuit 301b based on values of the feedback control signal ErrorCtrl(n). Similarly, in some embodiments, a voltage level of the trigger voltage Vtrig 476 is adjusted (e.g., using a digital-to-analog voltage converter (DAC)) based on values of the feedback control signal ErrorCtrl(n). By adjusting one or both of the slope of the ramp signal Vramp'(t) 474 and/or the voltage level of the trigger voltage Vtrig 476, a voltage level of the filtered time-varying output signal VsigOut(t) is adjusted to advantageously minimize or eliminate a difference between the filtered time-varying output signal VsigOut(t) and a time-varying reference signal generated using the time-varying input signal Vsig(t) while still advantageously providing a linear relationship 492 between the time-varying input signal Vsig(t) and the filtered time-varying output signal VsigOut(t).

Figure 4B:
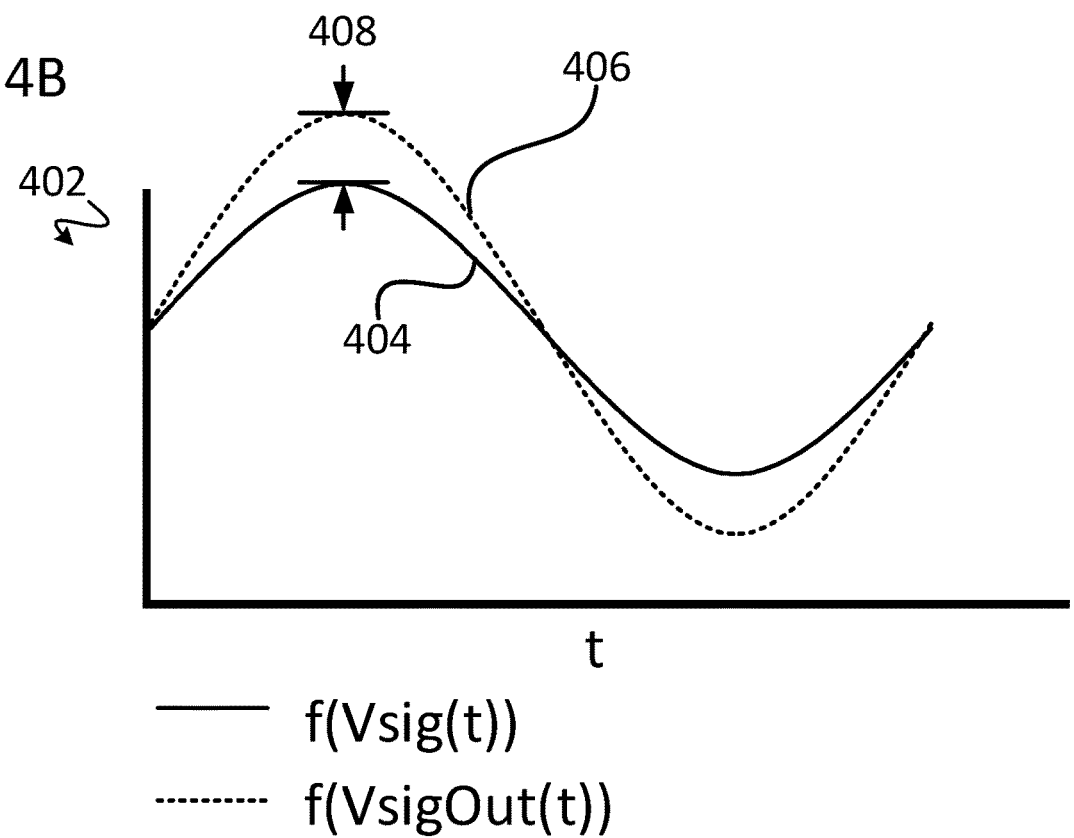

FIG. 4B illustrates a simplified signal diagram 402 of an example comparison performed by the error amplifier circuit 270 between a first signal f(Vsig(t)) 404 and a second signal f(VsigOut(t)) 406 to generate the feedback control signal ErrorCtrl(n). The first signal f(Vsig(t)) is the time-varying input signal Vsig(t), is representative of the time-varying input signal Vsig(t), or is a scaled representation of the time-varying input signal Vsig(t), e.g., SenseVsig(t). Similarly, the second signal f(VsigOut(t)) is the filtered time-varying output signal VsigOut(t), is a representation of the filtered time-varying output signal VsigOut(t), or is a scaled representation of the filtered time-varying output signal VsigOut(t), e.g., SenseVsigOut(t). In some embodiments, values of the feedback control signal ErrorCtrl(n), are representative of a determined difference 408 between the first signal f(Vsig(t)) 404 and the second signal f(VsigOut(t)) 406. In other embodiments, values of the feedback control signal ErrorCtrl(n), are based on, are proportional to, or are inversely proportional to the determined difference 408 between the first signal f(Vsig(t)) 404 and the second signal f(VsigOut(t)) 406. In some embodiments, a phase of the first signal f(Vsig(t)) 404 and/or the second signal f(VsigOut(t)) 406 is adjusted before the difference 408 is determined.

As described above, the feedback control signal ErrorCtrl(n) may be received by one or both of the adjustable current source circuit 301b and/or the trigger level generation circuit 313 to adjust an output level of the closed-loop converter 240/260 so that the time varying input signal Vsig(t) is amplified with high fidelity.

As shown in a simplified signal diagram 410 of FIG. 4C, which is similar to the simplified signal diagram 470 of FIG. 4A, by varying a current level of the error current Ierr(t) generated by the adjustable current source circuit 301b based on values of the feedback control signal ErrorCtrl(n), a slope of a ramp signal Vramp'(t) 412 may be adjusted, as shown by a dashed line 414, such that a duration of time T3 that the adjusted ramp signal Vramp'(t) 414 exceeds a trigger voltage Vtrig 416 is greater than or less than a duration of time T4 that the unadjusted ramp signal T4 exceeds the trigger voltage Vtrig 416. As a result, as shown in a simplified signal diagram 420 of FIG. 4C, the duration T3 of an adjusted pulse 422 of a switching signal Vpwm'(t) 424 is less than or greater than a duration T4 of an unadjusted pulse 426 of the switching signal Vpwm'(t) 424, thereby adjusting an output level of the filtered time varying output signal VsigOut(t). As shown in a simplified signal diagram 430 of FIG. 4C, a linear relationship 432 for the fixed input voltage Vin 164 is advantageously maintained between the time varying input signal Vsig(t) and the filtered time varying output signal VsigOut(t).

As shown in a simplified signal diagram 440 of FIG. 4D, by adjusting a level Vtrig' 444 of a trigger voltage Vtrig 446 generated by the trigger level generation circuit 309/313 based on values the feedback control signal ErrorCtrl(n), a duration of time T5 that a ramp signal Vramp'(t) 442 exceeds the adjusted trigger voltage Vtrig' 444 is greater than or less than a duration of time T6 that the ramp signal Vramp'(t) 442 exceeds the unadjusted trigger voltage Vtrig 446. As a result, as shown in a simplified signal diagram 450 of FIG. 4D, a duration T5 of an adjusted pulse 452 of the switching signal Vpwm'(t) 454 is greater than or less than a duration T6 of an unadjusted pulse 456 of the switching signal Vpwm'(t) 454, thereby adjusting an output level of the filtered time varying output signal VsigOut(t). As shown in a simplified signal diagram 460 of FIG. 4D, a linear relationship 462 for the fixed input voltage Vin 164 is advantageously maintained between the time varying input signal Vsig(t) and the filtered time varying output signal VsigOut(t).

Figure 5A:
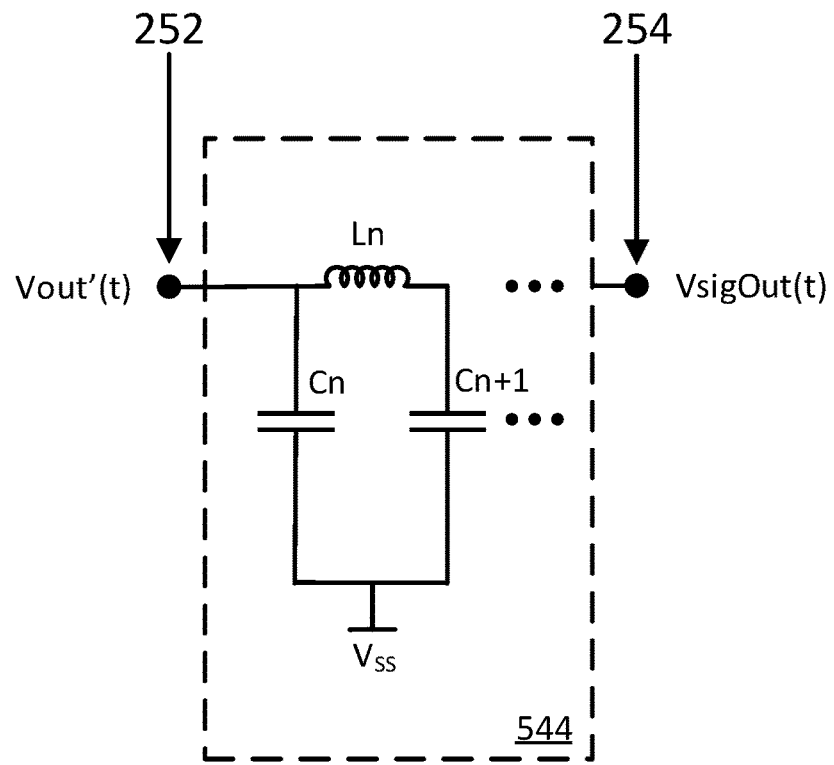
FIG. 5A is a simplified circuit diagram providing details of a filter circuit of a high-speed closed-loop switch-mode boost converter, in accordance with some embodiments.
Figure 5B:
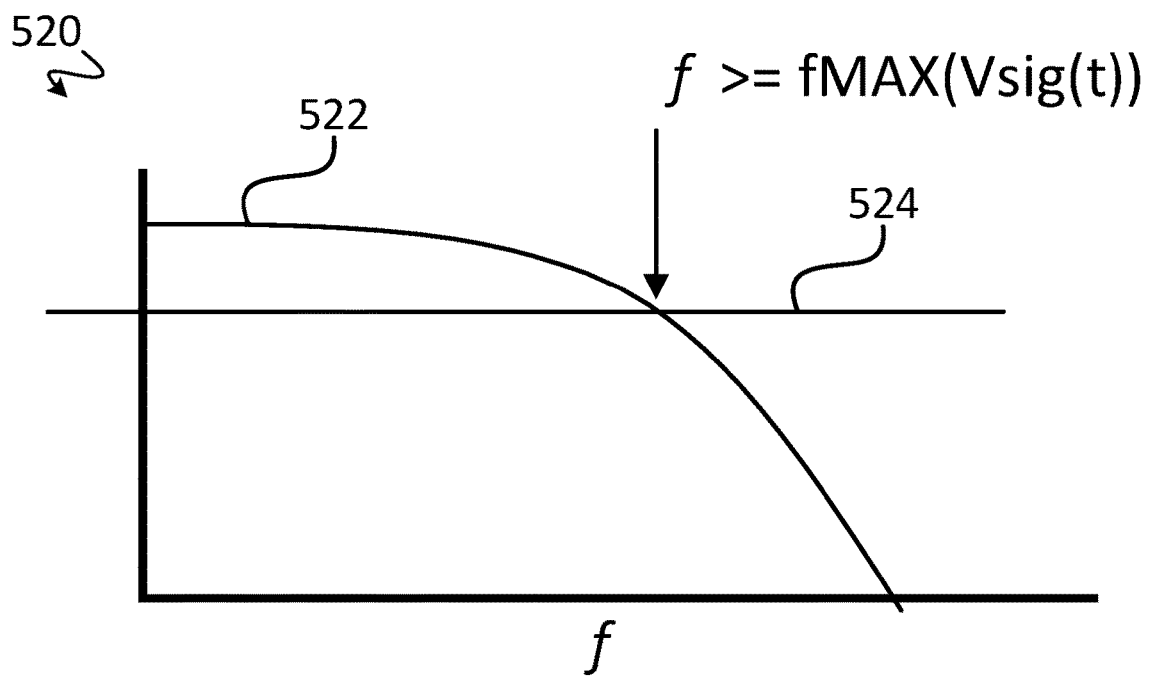
FIG. 5B is a simplified transfer function of a filter circuit of a high-speed closed-loop switch-mode boost converter, in accordance with some embodiments.

FIG. 5A illustrates a simplified circuit diagram of an example embodiment of a filter circuit 544 of the closed-loop converter 240/260, in accordance with some embodiments. In some embodiments, the filter circuit 244 of FIG. 2A/2B is realized as the filter circuit 544. In the embodiment shown, the filter circuit 544 is realized as an N-pole PI filter. The filter circuit 544 receives the time varying output signal Vout'(t) at the signal output node 252 and outputs the filtered time-varying output signal VsigOut(t) at the signal output node 254. The order of the filter circuit 544 is higher than a second-order filter. That is, the filter circuit 544 is not realized as a first-order filter, such as an RC or RL filter, or as a second-order filter, such as an RLC filter. The filter circuit 544 generally includes N cascaded filter sections, each generally including a filtering inductor Ln, a filtering capacitor Cn, and a filtering capacitor Cn+1, coupled as shown. In some embodiments, the number of cascaded filter sections N is 1 and thus the filter circuit 544 includes first and second filtering capacitors and a first filtering inductor. In other embodiments, the number of cascaded filter sections N is 2 and thus the filter circuit 544 includes first, second, third, and fourth filtering capacitors and first and second filtering inductors. In some embodiments, parallel capacitors may be realized as individual capacitors or as a single capacitor. In still yet other embodiments, the number of cascaded filter sections N is greater than 2. In some embodiments, the filter circuit 544 is implemented as one of a Chebyshev filter circuit, a Butterworth filter circuit, an Elliptic filter circuit, a Bessel filter circuit, an active filter circuit (e.g., using one or more op-amps), a digital filter circuit (e.g., using a digital-signal-processor), or another filter circuit that is suitable for substantially passing frequencies that are equal to or less than the maximum frequency component fMAX(Vsig(t)) of the time-varying input signal Vsig(t) and substantially attenuating frequencies that are greater than the maximum frequency component fMAX (Vsig(t)) of the time-varying input signal Vsig(t), where fMAX(Vsig(t)) is substantially greater than DC. In some embodiments, the filter circuit 544 has a 3 dB cutoff frequency that is greater than the maximum frequency component fMAX(Vsig(t)) of the time-varying input signal Vsig(t), as illustrated in the simplified signal diagram 520 of FIG. 5B. The simplified signal diagram 520 shows an example transfer function 522 of the filter circuit 244/544 having a 3 db cutoff 524 at a frequency f that is greater than or equal to the maximum frequency component fMAX(Vsig(t)) of the time-varying input signal Vsig(t). Aspects of the transfer function such as passband/stopband ripple (when present) have been omitted for simplicity. In some embodiments, roll-off of the filter circuit 244/544 may be significantly steeper than illustrated.

Figure 6:
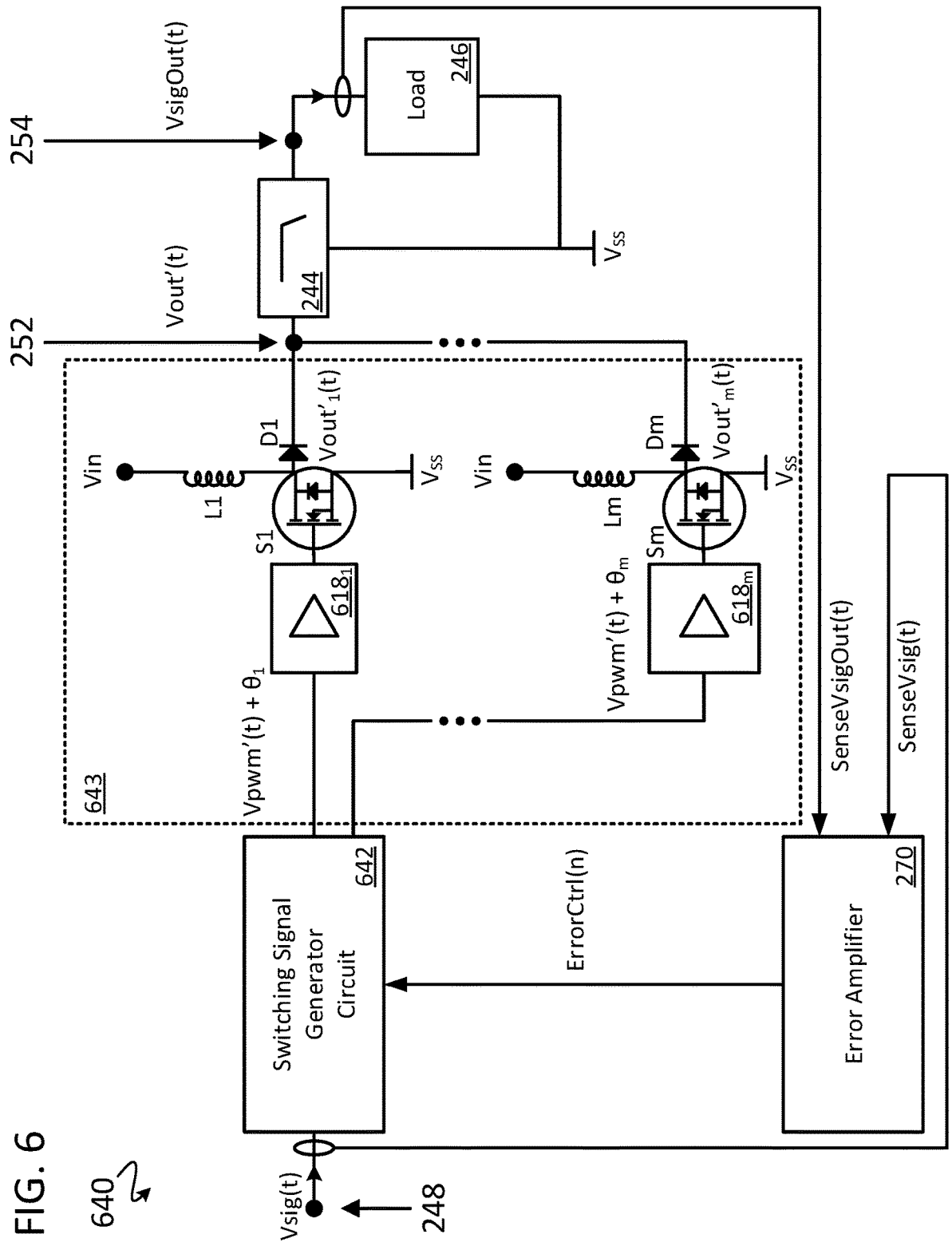
FIG. 6 is a simplified circuit diagram of a multi-phase closed-loop switch-mode boost converter, in accordance with some embodiments.

FIG. 6 illustrates a simplified circuit diagram of a multiphase high-speed closed-loop switch-mode boost converter ("closed-loop converter") 640 with linear signal characteristics, in accordance with some embodiments. Like numbered elements of the closed-loop converter 640 may have similar descriptions as corresponding like-numbered elements of the converter 100 of FIG. 1A and the closed-loop converter 240/260, although design considerations may cause actual implementations of these elements to be rendered differently in the different circuits. In general, the closed-loop converter 640 includes m switch-mode boost amplifier sections of an amplifier circuit 643, each of which generally includes a respective inductor of the inductor L1-$m$, a switch of the switches S1-$m$ and a synchronous or passive output rectifier, shown here as diodes D1-$m$. A switching signal generator circuit 642, similar to the switching signal generator circuit 242, outputs m copies of the switching signal Vpwm'(t), each copy of which is separated by a respective phase offset $\theta$-$\theta_m$. The m copies of the switching signal Vpwm'(t), with varying phase offsets, are received by m respective switch driver circuits 618$_{1-m}$. The m switch-mode boost amplifier sections of the amplifier circuit 643 generate m time-varying output signals Vout'$_{1-m}$(t) which are recombined at the signal output node 252 to generate the time-varying output signal Vout'(t).

Figure 7:
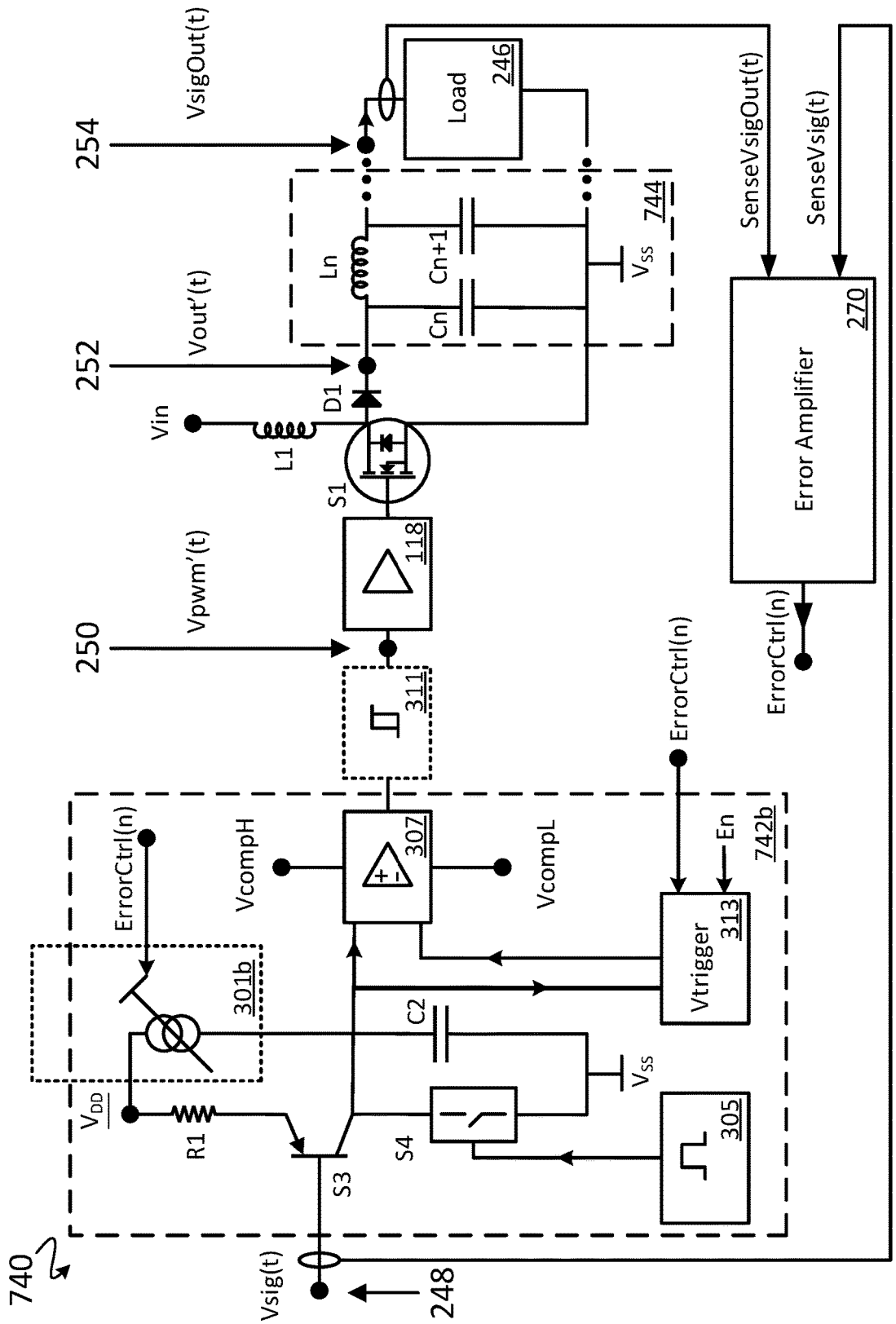
FIG. 7 is a simplified circuit diagram of a high-speed closed-loop switch-mode boost converter, in accordance with some embodiments.

FIG. 7 illustrates a simplified circuit diagram of a high-speed, closed-loop switch-mode boost converter ("closed-loop converter") 740 with linear signal characteristics, in accordance with some embodiments. Like numbered elements of the closed-loop converter 740 may have similar descriptions as corresponding like-numbered elements of the converter 100 of FIG. 1A and the closed-loop converter 240 of FIG. 2A, although design considerations may cause actual implementations of these elements to be rendered differently in the different circuits. Additionally, the closed-loop converter 740 includes an embodiment of a switching signal generator circuit portion 742b similar to the switching signal generator circuit 342b of FIG. 3C and a filter circuit 744 similar to the filter circuit 544 of FIG. 5A. The closed-loop converter 740 advantageously generates a filtered time-varying output signal VsigOut(t) that relates substantially linearly to the time-varying input signal Vsig(t).

Figure 8:
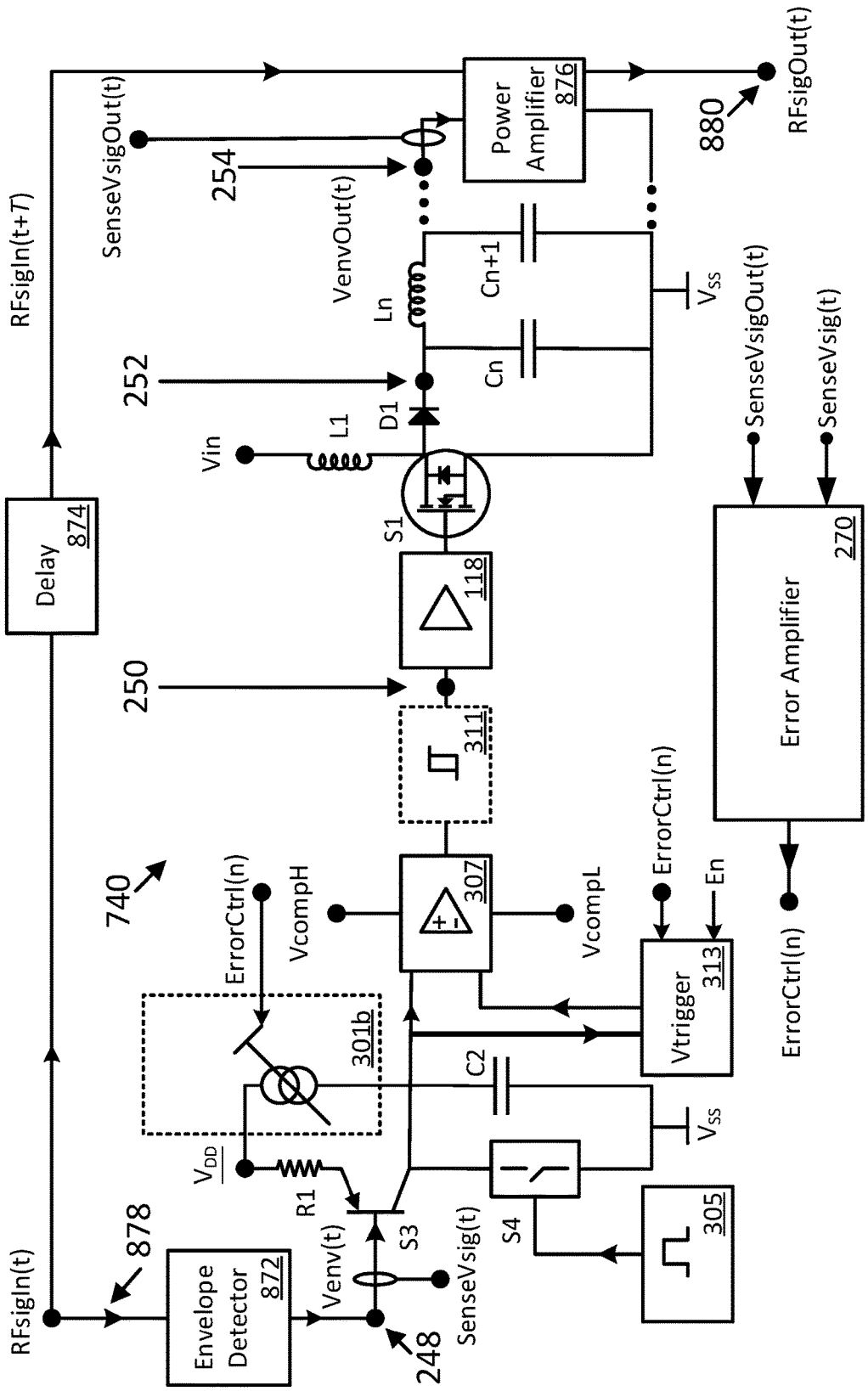
FIG. 8 is a simplified circuit diagram of a radio frequency (RF) amplifier implemented using a high-speed closed-loop switch-mode boost converter, in accordance with some embodiments.

FIG. 8 illustrates a simplified circuit diagram of a radio-frequency (RF) amplifier circuit 840 capable of high-speed closed-loop envelope tracking, in accordance with some embodiments. The RF amplifier circuit 840 includes an embodiment of the closed-loop converter 740 as shown and described with reference to FIG. 7. Additionally, the RF amplifier circuit 840 generally includes an envelope detector circuit 872, a signal delay circuit 874, and a power amplifier circuit 876. The RF amplifier circuit 840 receives an RF input signal RFsigIn(t) at an input node 878. The envelope detector circuit 872 is a circuit suitable for generating, at an envelope signal output node, a time-varying envelope signal Venv(t) that corresponds to an envelope of the RF input signal RFsigIn(t). The time-varying envelope signal Venv(t) is received at the signal input node 248 of the closed-loop converter 740. In some embodiments, a maximum frequency component fMAX(Venv(t)) of the time-varying envelope signal Venv(t) is greater than 10 MHz. The closed-loop converter 740 generates a filtered time-varying output signal VenvOut(t) (i.e., an amplified envelope signal) at the signal output node 254. The filtered time-varying output signal VenvOut(t) is received by the power amplifier circuit 876 and is used thereby as a power rail. The power amplifier circuit 876 receives the RF input signal RFsigIn(t) or a signal based on the RF input signal RFsigIn(t) (e.g., a delayed RF input signal RFsigIn(t+T)), delayed by the signal delay circuit 874, and generates an amplified signal RFsigOut(t) at an RF signal output node 880. The RF amplifier circuit 840 implemented with the closed-loop converter 740 advantageously uses a single boost stage (e.g., the switch S1) and does not require an additional switch-mode buck power converter or linear power converter. Thus, the overall efficiency of the RF amplifier circuit 840 is improved over typical RF amplifier circuits having additional switch-mode converters, and/or linear power converters.

Figure 9:
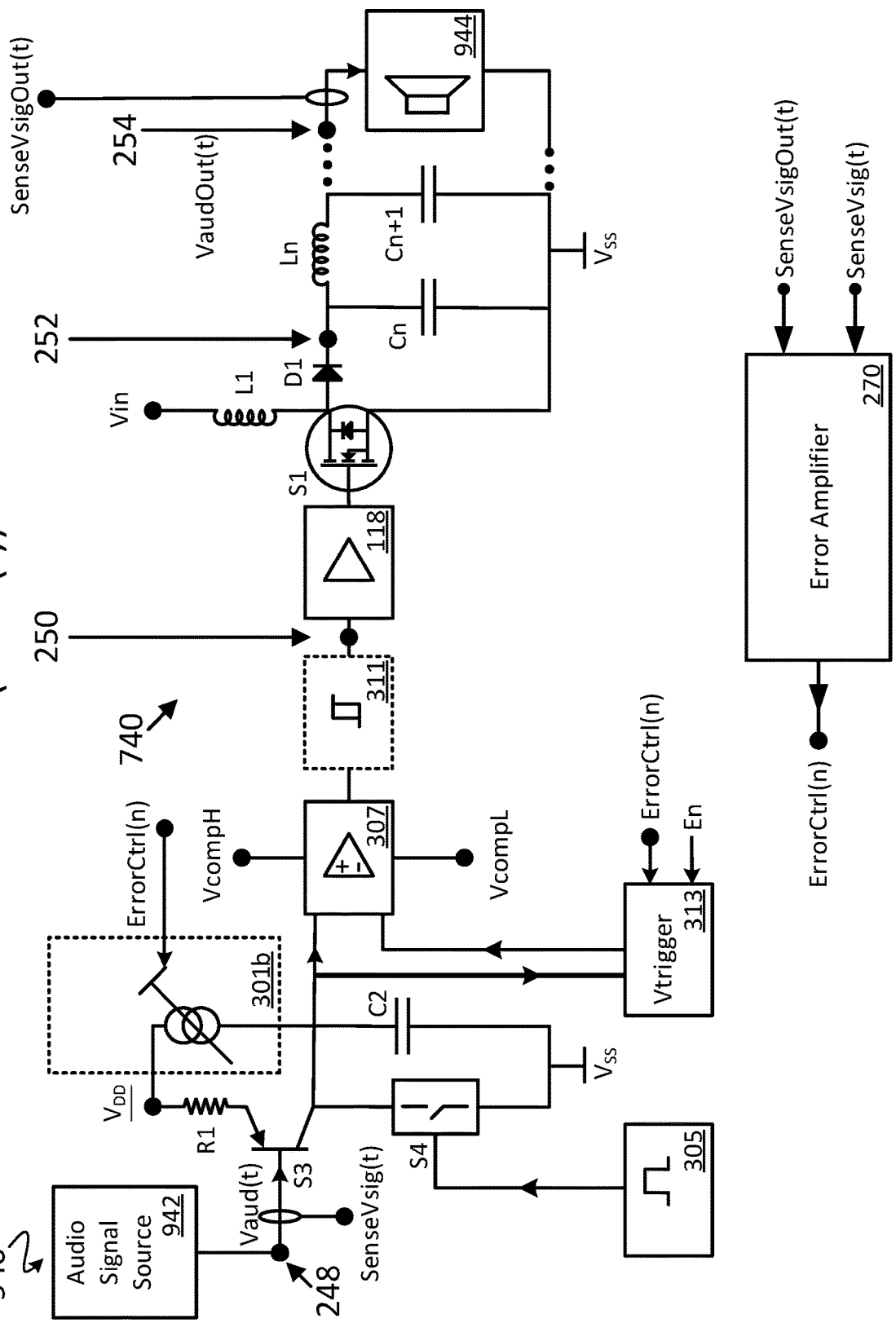
FIG. 9 is a simplified circuit diagram of an audio amplifier implemented using a high-speed closed-loop switch-mode boost converter, in accordance with some embodiments.

FIG. 9 illustrates a simplified circuit diagram of an audio amplifier circuit 940 with high-speed closed-loop envelope tracking, in accordance with some embodiments. The audio amplifier circuit 940 includes an embodiment of the closed-loop converter 740 as shown and described with reference to FIG. 7. Additionally, the audio amplifier circuit 940 generally includes an audio signal source 942 (i.e., an audio input circuit) and an audio transducer circuit or downstream audio circuitry 944 (e.g., a speaker, additionally amplification, or additional signal conditioning circuitry). The audio amplifier circuit 940 receives a time-varying audio signal Vaud(t) from the audio signal source 942 at the signal input node 248 of the closed-loop converter 740. In some embodiments, a maximum frequency component fMAX(Vaud(t)) of the time-varying audio signal Vaud(t) is greater than 20 Hz and less than or equal to 20 kHz. The closed-loop converter 740 generates a filtered time-varying output signal VaudOut(t) (i.e., an amplified audio signal) at the signal output node 254. The filtered time-varying output signal VaudOut(t) is received by the audio transducer or downstream audio circuitry 944. The audio amplifier circuit 940, implemented with the closed-loop converter 740, advantageously uses a single boost stage (e.g., the switch S1) and does not use an additional switch-mode buck power converter or linear power converter. Thus, the overall efficiency of the audio amplifier circuit 940 is improved over audio amplifier circuits having additional switch-mode converters, and/or linear power converters.

In the preceding description, like reference numbers were used to identify like elements. Furthermore, drawings are intended to illustrate major features of example embodiments in a diagrammatic manner. The drawings are not intended to depict every feature of actual embodiments nor relative dimensions of the depicted elements and are not drawn to scale. Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A closed-loop switch-mode boost converter comprising:
   a switching signal generator circuit for generating a switching signal, the switching signal generator circuit comprising a signal input node for receiving a time-varying input signal, and a switching signal output node for outputting the switching signal, a duty-cycle of the switching signal having a first non-linear relationship to an amplitude of the time-varying input signal;
   a switch-mode boost amplifier ("amplifier") circuit comprising an input voltage node for receiving an input voltage, a switch driver input node coupled to the switching signal output node for receiving the switching signal, and a signal output node for outputting a time-varying output signal, an amplitude of the time-varying output signal having a second non-linear relationship to the duty-cycle of the switching signal, and the time-varying output signal having a linear relationship to the time-varying input signal based on the first non-linear relationship and the second non-linear relationship;
   a filter circuit with a filter input node coupled to the signal output node of the amplifier circuit to receive the time-varying output signal, and a filter output node for outputting a filtered time-varying output signal; and
   an error amplifier circuit having a first input node coupled to the signal input node for receiving the time-varying input signal, and a second input node coupled to the filter output node of the amplifier circuit to receive the filtered time-varying output signal, the error amplifier circuit producing a feedback control signal using the time-varying input signal and the filtered time-varying output signal, the filtered time-varying output signal being adjusted based on the feedback control signal; wherein:
   the time-varying input signal has a first maximum frequency component, the first maximum frequency component being substantially greater than DC; and
   the filtered time-varying output signal has a second maximum frequency component, the second maximum frequency component being substantially the same as the first maximum frequency component.

2. The closed-loop switch-mode boost converter of claim 1, wherein:
   the filter circuit is of a higher order than a second-order filter.

3. The closed-loop switch-mode boost converter of claim 1, wherein:
   the switching signal generator circuit comprises:
   a capacitor comprising a first terminal coupled to a bias voltage node; and
   a voltage-to-current conversion circuit having a first node coupled to a positive voltage node, a second node coupled to a second terminal of the capacitor, and a current conduction control node coupled to the signal input node for receiving the time-varying input signal and controlling a charging current flow from the positive voltage node to the capacitor to generate a ramp signal, the charging current flow being proportional to an amplitude of the time-varying input signal.

4. The closed-loop switch-mode boost converter of claim 3, wherein:
   the switching signal generator circuit further comprises an adjustable current source circuit coupled to the error amplifier circuit to receive the feedback control signal and produce an error current based on the feedback control signal, the error current contributing to the charging current flow from the positive voltage node of the voltage-to-current conversion circuit to the capacitor to generate the ramp signal, a slope of the ramp signal being adjusted by the error current.

5. The closed-loop switch-mode boost converter of claim 3, wherein:
   the switching signal generator circuit further comprises:
   a trigger level generation circuit for generating a trigger voltage, the trigger level generation circuit comprising a trigger voltage output node for outputting the trigger voltage; and
   a voltage comparison circuit with a first input coupled to the second terminal of the capacitor, a second input coupled to the trigger level generation circuit for receiving the trigger voltage, and an output for generating the switching signal based on a comparison of a voltage at the second terminal of the capacitor to the trigger voltage.

6. The closed-loop switch-mode boost converter of claim 5, wherein:
   the trigger level generation circuit is configured to receive the feedback control signal from the error amplifier circuit, the trigger voltage being adjusted based on the feedback control signal.

7. The closed-loop switch-mode boost converter of claim 1, wherein:
   the switching signal has a switching frequency that is at least two times greater than the first maximum frequency component of the time-varying input signal; and
   the filter circuit substantially passes, from the filter input node to the filter output node, first frequencies that are equal to or less than the first maximum frequency component, and substantially attenuates second frequencies that are greater than the first maximum frequency component.

8. The closed-loop switch-mode boost converter of claim 1, wherein:
   the switching signal generator circuit comprises:
   a capacitor comprising a first terminal coupled to a bias voltage node;
   a voltage-to-current conversion circuit having a first node coupled to a positive voltage node, a second node coupled to a second terminal of the capacitor, and a current conduction control node coupled to the signal input node for receiving the time-varying input signal and controlling a charging current flow from the positive voltage node to the capacitor to generate a ramp signal, the charging current flow being proportional to an amplitude of the time-varying input signal;
   a discharge switch comprising a high-side coupled to the second terminal of the capacitor, a low-side coupled to the bias voltage node, and a switch control node coupled to a switch control circuit to control a discharge current flow from the capacitor to the bias voltage node;
a trigger level generation circuit for generating a trigger voltage, the trigger level generation circuit comprising a trigger voltage output node for outputting the trigger voltage; and
a voltage comparison circuit with a first input coupled to the second terminal of the capacitor, a second input coupled to the trigger level generation circuit for receiving the trigger voltage, and an output for generating the switching signal based on a comparison of a voltage at the second terminal of the capacitor to the trigger voltage.

9. The closed-loop switch-mode boost converter of claim 8, wherein:
one or both of the charging current flow or the trigger voltage are adjusted based on the feedback control signal to adjust a duty cycle of the switching signal.

10. The closed-loop switch-mode boost converter of claim 8, wherein:
a maximum ramp voltage of the ramp signal is about equal to an upper voltage comparison limit, the maximum ramp voltage being based on one or more of the voltage-to-current conversion circuit, a capacitance value of the capacitor, a discharge frequency of the discharge switch and a discharge duty-cycle of discharge switch.

11. The closed-loop switch-mode boost converter of claim 10, wherein:
a discharge period of the discharge switch is equal to or greater than a time duration to fully discharge the capacitor to the bias voltage node when the discharge switch is in a conduction state; and
the discharge frequency of the discharge switch is equal to or greater than two times the first maximum frequency component of the time-varying input signal.

12. The closed-loop switch-mode boost converter of claim 8, wherein:
the trigger level generation circuit further comprises:
a voltage input node coupled to the second terminal of the capacitor to receive a plurality of ramp voltages of the ramp signal, wherein the trigger level generation circuit:
samples the plurality of ramp voltages to generate a plurality of ramp voltage samples;
determines a minimum ramp peak voltage using the plurality of ramp voltage samples; and
generates the trigger voltage based on the minimum ramp peak voltage.

13. The closed-loop switch-mode boost converter of claim 12, wherein:
the trigger voltage is greater than a ground voltage and less than or equal to the minimum ramp peak voltage.

14. The closed-loop switch-mode boost converter of claim 8, wherein:
the trigger voltage is based on a fixed percentage of a voltage rail of the voltage comparison circuit.

15. The closed-loop switch-mode boost converter of claim 1,
wherein:
the amplifier circuit comprises:
a first switch driver circuit comprising the switch driver input node that is coupled to the switching signal output node for receiving the switching signal, and a first drive signal output node for outputting a first drive signal;
a first switching transistor with a first drive node coupled to the first drive signal output node for receiving the first drive signal, a first high-side coupled to the input voltage node through a first inductor, and a first low-side coupled to a bias voltage node; and
a first output rectifier coupled between the first high-side of the first switching transistor and the signal output node of the amplifier circuit.

16. The closed-loop switch-mode boost converter of claim 15, wherein:
the amplifier circuit further comprises:
a second switch driver circuit with a second input node coupled to another switching signal output node of the switching signal generator circuit for receiving another switching signal, and a second drive signal output node for outputting a second drive signal;
a second switching transistor with a second drive node coupled to the second drive signal output node for receiving the second drive signal, a second high-side coupled to the input voltage node through a second inductor, and a second low-side coupled to the bias voltage node; and
a second output rectifier coupled between the second high-side of the second switching transistor and the signal output node of the amplifier circuit.

17. The closed-loop switch-mode boost converter of claim 1, wherein:
the filter circuit comprises a low-pass filter circuit selected from a group of filters consisting of a Chebyshev filter circuit, a Butterworth filter circuit, a Bessel filter circuit, and an Elliptic filter circuit.

18. The closed-loop switch-mode boost converter of claim 17, wherein:
the low-pass filter circuit has a 3 dB cutoff frequency that is greater than the first maximum frequency component of the time-varying input signal.

19. The closed-loop switch-mode boost converter of claim 1, wherein:
the filter circuit comprises:
a first filtering capacitor coupled in parallel between the filter input node and a bias voltage node;
a first filtering inductor, a first terminal of the first filtering inductor being coupled to the filter input node, and a second terminal of the first filtering inductor being coupled to the filter output node; and
a second filtering capacitor coupled in parallel between the second terminal of the first filtering inductor and the bias voltage node.

20. The closed-loop switch-mode boost converter of claim 19, wherein:
the filter circuit further comprises:
a second filtering inductor coupled in series between the second terminal of the first filtering inductor and the filter output node;
a third filtering capacitor coupled in parallel between a first terminal of the second filtering inductor and the bias voltage node; and
a fourth filtering capacitor coupled in parallel between a second terminal of the second filtering inductor and the bias voltage node.

21. The closed-loop switch-mode boost converter of claim 1, wherein:
the linear relationship between the time-varying input signal and the filtered time-varying output signal is based on a first amplitude of the time-varying input signal and a second amplitude of the filtered time-varying output signal, the second amplitude being substantially linearly proportional to the first amplitude of the filtered time-varying output signal.

22. The closed-loop switch-mode boost converter of claim 1, further comprising:
- an audio input circuit, the signal input node of the switching signal generator circuit being coupled to the audio input circuit to receive an audio signal; and
- an audio transducer circuit coupled to the filter output node of the filter circuit to receive an amplified audio signal;

wherein:
the time-varying input signal is the audio signal; and
the amplified audio signal is the filtered time-varying output signal.

23. The closed-loop switch-mode boost converter of claim 1, further comprising:
- an envelope detector circuit having a signal input node to receive an input signal, and an envelope signal output node coupled to the signal input node of the switching signal generator circuit to output an envelope signal, the envelope signal being a signal envelope of the input signal; and
- a power amplifier (PA) circuit having a PA signal input node to receive the input signal, a PA signal output node to output an amplified signal, a PA low-side bias node, and a PA high-side bias node coupled to the filter output node of the filter circuit to receive an amplified envelope signal;

wherein:
the time-varying input signal is the envelope signal; and
the amplified envelope signal is the filtered time-varying output signal.

* * * * *